United States Patent
Hatanaka et al.

(10) Patent No.: US 10,431,229 B2
(45) Date of Patent: Oct. 1, 2019

(54) DEVICES AND METHODS FOR ENCODING AND DECODING AUDIO SIGNALS

(71) Applicant: Sony Corporation, Tokyo (JP)

(72) Inventors: Mitsuyuki Hatanaka, Kanagawa (JP); Toru Chinen, Kanagawa (JP)

(73) Assignee: Sony Corporation, Tokyo (JP)

( * ) Notice: Subject to any disclaimer, the term of this patent is extended or adjusted under 35 U.S.C. 154(b) by 163 days.

(21) Appl. No.: 15/424,741

(22) Filed: Feb. 3, 2017

(65) Prior Publication Data
US 2017/0148452 A1    May 25, 2017

Related U.S. Application Data

(63) Continuation of application No. 13/978,175, filed as application No. PCT/JP2012/050173 on Jan. 6, 2012, now abandoned.

(30) Foreign Application Priority Data

Jan. 14, 2011 (JP) .................................. 2011-006233

(51) Int. Cl.
G10L 19/00      (2013.01)
G10L 19/02      (2013.01)
(Continued)

(52) U.S. Cl.
CPC ........ G10L 19/0204 (2013.01); G10L 19/008 (2013.01); G10L 19/028 (2013.01);
(Continued)

(58) Field of Classification Search
None
See application file for complete search history.

(56) References Cited

U.S. PATENT DOCUMENTS 6,266,644 B1    7/2001  Levine
7,933,769 B2 *  4/2011  Bessette .............. G10L 19/0208
                                                        375/240.13
(Continued)

FOREIGN PATENT DOCUMENTS

CN      1571993 A    1/2005
CN      1932970 A    3/2007
(Continued)

OTHER PUBLICATIONS

Japanese Patent Abstracts, Translation, 2007-187905, Nettre et al, pp. 1-27.*

(Continued)

Primary Examiner — Michael N Opsasnick
(74) Attorney, Agent, or Firm — Wolf, Greenfield & Sacks, P.C.

(57) ABSTRACT

A signal processing device, method, and program that may obtain audio at a higher audio quality when decoding an audio signal. An envelope information generating unit generates envelope information representing an envelope form of high frequency components of an audio signal to be encoded. A sine wave information generating unit extracts a sine wave signal from the high frequency components of the audio signal, and generates a sine wave information representing an emergence start position of the sine wave signal. An encoding stream generating unit multiplexes the envelope information, the sine wave information, and low frequency components of the audio signal that have been encoded, and outputs an encoding stream obtained as the result. The high frequency components included in the sine wave signal may be predicted at a higher accuracy from the envelope information and the sine wave information at the receiving side of the encoding stream.

17 Claims, 24 Drawing Sheets

(51) Int. Cl.
*G10L 19/008* (2013.01)
*G10L 19/028* (2013.01)
*G10L 19/093* (2013.01)
G10L 21/038 (2013.01)
H03M 7/40 (2006.01)

(52) U.S. Cl.
CPC ........ *G10L 19/0208* (2013.01); *G10L 19/093* (2013.01); *G10L 21/038* (2013.01); *H03M 7/40* (2013.01)

(56) References Cited

U.S. PATENT DOCUMENTS

| | | | |
|---|---|---|---|
| 8,793,123 B2 * | 7/2014 | Disch ................. | G10L 19/0204 704/205 |
| 8,949,119 B2 | 2/2015 | Yamamoto et al. | |
| 9,177,563 B2 | 11/2015 | Yamamoto et al. | |
| 9,208,795 B2 | 12/2015 | Yamamoto et al. | |
| 9,236,061 B2 * | 1/2016 | Ekstrand ............... | G10L 19/022 |
| 9,294,062 B2 | 3/2016 | Hatanaka et al. | |
| 9,361,900 B2 | 6/2016 | Yamamoto et al. | |
| 9,390,717 B2 | 7/2016 | Yamamoto et al. | |
| 9,406,306 B2 | 8/2016 | Yamamoto et al. | |
| 9,406,312 B2 | 8/2016 | Yamamoto et al. | |
| 9,437,197 B2 | 9/2016 | Honma et al. | |
| 9,437,198 B2 | 9/2016 | Hatanaka et al. | |
| 9,536,542 B2 | 1/2017 | Yamamoto et al. | |
| 9,542,952 B2 | 1/2017 | Hatanaka et al. | |
| 9,583,112 B2 | 2/2017 | Yamamoto et al. | |
| 9,659,573 B2 | 5/2017 | Yamamoto et al. | |
| 9,679,580 B2 | 6/2017 | Yamamoto et al. | |
| 9,691,410 B2 | 6/2017 | Yamamoto et al. | |
| 9,767,814 B2 | 9/2017 | Yamamoto et al. | |
| 9,767,824 B2 | 9/2017 | Yamamoto et al. | |
| 9,842,603 B2 | 12/2017 | Yamamoto et al. | |
| 9,875,746 B2 | 1/2018 | Honma et al. | |
| 10,083,700 B2 | 9/2018 | Hatanaka et al. | |
| 2001/0013003 A1 * | 8/2001 | Taori ...................... | G10L 19/02 704/500 |
| 2004/0247037 A1 * | 12/2004 | Honma ................. | G10L 21/038 375/259 |
| 2005/0080621 A1 * | 4/2005 | Tsushima .............. | G10L 21/038 704/229 |
| 2005/0149339 A1 | 7/2005 | Tanaka et al. | |
| 2005/0228648 A1 | 10/2005 | Heikkinen | |
| 2007/0063877 A1 | 3/2007 | Shmunk et al. | |
| 2007/0185707 A1 | 8/2007 | Gerrits et al. | |
| 2008/0097751 A1 * | 4/2008 | Tsuchinaga ........... | G10L 19/002 704/205 |
| 2008/0140425 A1 | 6/2008 | Shimada | |
| 2008/0221905 A1 * | 9/2008 | Schnell ................. | G10L 19/025 704/500 |
| 2008/0235033 A1 | 9/2008 | Lee et al. | |
| 2009/0271204 A1 * | 10/2009 | Tammi ................. | G10L 19/0208 704/500 |
| 2009/0306975 A1 | 12/2009 | Pietsch et al. | |
| 2010/0063811 A1 * | 3/2010 | Gao ....................... | G10L 19/025 704/230 |
| 2010/0250261 A1 * | 9/2010 | Laaksonen ............. | G10L 19/02 704/500 |
| 2011/0202353 A1 | 8/2011 | Neuendorf et al. | |
| 2012/0243526 A1 | 9/2012 | Yamamoto et al. | |
| 2013/0028427 A1 | 1/2013 | Yamamoto et al. | |
| 2013/0030818 A1 | 1/2013 | Yamamoto et al. | |
| 2013/0124214 A1 | 5/2013 | Yamamoto et al. | |
| 2013/0202118 A1 | 8/2013 | Yamamoto et al. | |
| 2013/0208902 A1 | 8/2013 | Yamamoto et al. | |
| 2013/0275142 A1 | 10/2013 | Hatanaka et al. | |
| 2014/0006037 A1 | 1/2014 | Honma et al. | |
| 2014/0156289 A1 | 6/2014 | Hatanaka et al. | |
| 2014/0172433 A2 | 6/2014 | Honma et al. | |
| 2014/0180682 A1 | 6/2014 | Shi et al. | |
| 2014/0200899 A1 | 7/2014 | Yamamoto et al. | |
| 2014/0200900 A1 | 7/2014 | Yamamoto et al. | |
| 2014/0205101 A1 | 7/2014 | Yamamoto et al. | |
| 2014/0205111 A1 | 7/2014 | Hatanaka et al. | |
| 2014/0211948 A1 | 7/2014 | Hatanaka et al. | |
| 2014/0214432 A1 | 7/2014 | Hatanaka et al. | |
| 2014/0214433 A1 | 7/2014 | Hatanaka et al. | |
| 2015/0088528 A1 | 3/2015 | Toguri et al. | |
| 2015/0120307 A1 | 4/2015 | Yamamoto et al. | |
| 2016/0012829 A1 | 1/2016 | Yamamoto et al. | |
| 2016/0019911 A1 | 1/2016 | Yamamoto et al. | |
| 2016/0140982 A1 | 5/2016 | Yamamoto et al. | |
| 2016/0225376 A1 | 8/2016 | Honma et al. | |
| 2016/0322057 A1 | 11/2016 | Yamamoto et al. | |
| 2016/0343380 A1 | 11/2016 | Hatanaka et al. | |
| 2017/0076737 A1 | 3/2017 | Yamamoto et al. | |
| 2017/0148452 A1 | 5/2017 | Hatanaka et al. | |
| 2017/0229139 A1 | 8/2017 | Yamamoto et al. | |
| 2017/0236530 A1 | 8/2017 | Yamamoto et al. | |
| 2017/0337928 A1 | 11/2017 | Yamamoto et al. | |
| 2017/0352365 A1 | 12/2017 | Yamamoto et al. | |
| 2018/0197555 A1 | 7/2018 | Yamamoto et al. | |

FOREIGN PATENT DOCUMENTS

| | | | |
|---|---|---|---|
| CN | 101297356 A | | 10/2008 |
| JP | 2001-521648 A | | 11/2001 |
| JP | 2004-053940 A | | 2/2004 |
| JP | 2007-187905 A | | 7/2007 |
| JP | 2007187905 A | * | 7/2007 |
| JP | 2011-527448 A | | 10/2011 |
| WO | WO 2010/003544 A1 | | 1/2010 |
| WO | WO 2010/024371 A1 | | 3/2010 |

OTHER PUBLICATIONS

U.S. Appl. No. 13/498,234, filed Apr. 12, 2012, Yamamoto et al.
U.S. Appl. No. 13/499,559, filed Jun. 11, 2012, Yamamoto et al.
U.S. Appl. No. 13/639,325, filed Oct. 4, 2012, Yamamoto et al.
U.S. Appl. No. 13/639,338, filed Oct. 4, 2012, Yamamoto et al.
U.S. Appl. No. 13/640,500, filed Apr. 19, 2013, Yamamoto et al.
U.S. Appl. No. 13/877,192, filed Apr. 1, 2013, Yamamoto et al.
U.S. Appl. No. 14/006,148, filed Sep. 19, 2013, Honma et al.
U.S. Appl. No. 14/236,350, filed Jan. 31, 2014, Yamamoto et al.
U.S. Appl. No. 14/237,990, filed Feb. 10, 2014, Yamamoto et al.
U.S. Appl. No. 14/237,993, filed Feb. 10, 2014, Yamamoto et al.
U.S. Appl. No. 14/585,974, filed Dec. 30, 2014, Yamamoto et al.
U.S. Appl. No. 14/861,734, filed Sep. 22, 2015, Yamamoto et al.
U.S. Appl. No. 14/870,268, filed Sep. 30, 2015, Yamamoto et al.
U.S. Appl. No. 15/003,960, filed Jan. 22, 2016, Yamamoto et al.
U.S. Appl. No. 15/206,783, filed Jul. 11, 2016, Yamamoto et al.
U.S. Appl. No. 14/390,810, filed Oct. 6, 2014, Toguri et al.
U.S. Appl. No. 14/917,825, filed Mar. 9, 2016, Honma et al.
U.S. Appl. No. 15/106,498, filed Jun. 20, 2016, Yamamoto.
U.S. Appl. No. 13/978,175, filed Jul. 3, 2013, Hatanaka et al.
U.S. Appl. No. 14/238,265, filed Feb. 11, 2014, Hatanaka et al.
U.S. Appl. No. 14/239,574, filed Feb. 19, 2014, Hatanaka et al.
U.S. Appl. No. 14/239,568, filed Feb. 19, 2014, Hatanaka et al.
U.S. Appl. No. 14/238,243, filed Feb. 11, 2014, Hatanaka et al.
U.S. Appl. No. 15/227,024, filed Aug. 3, 2016, Hatanaka et al.
U.S. Appl. No. 14/104,828, filed Dec. 12, 2013, Shi et al.
U.S. Appl. No. 14/239,797, filed Feb. 20, 2014, Hatanaka et al.
U.S. Appl. No. 15/357,877, filed Nov. 21, 2016, Yamamoto et al.
Korean Office Action dated Jun. 28, 2018 in connection with Korean Application No. 10-2013-7017522, and English translation thereof.
International Search Report and Written Opinion dated Feb. 14, 2012 in connection with International Application No. PCT/JP2012/050173, and English translation thereof.
International Preliminary Report on Patentability dated Jul. 25, 2013 in connection with International Application No. PCT/JP2012/050173, and English translation thereof.
Chinese Office Action and English translation thereof dated Aug. 12, 2014 in connection with Chinese Application No. 201280004776.X.
Japanese Office Action and English translation thereof dated Sep. 30, 2014 in connection with Application No. 2011-006233.

(56) References Cited

OTHER PUBLICATIONS

Extended European Search Report dated Nov. 15, 2016 in connection with European Application No. 12734067.7.
Wolters et al., A close look into MPEG-4 High Efficiency AAC. Audio Engineering Society Convention Paper. Presented at the 115th Convention Oct. 10-13, 2003, New York NY, USA. pp. 1-16.

* cited by examiner

DEVICES AND METHODS FOR ENCODING AND DECODING AUDIO SIGNALS

CROSS REFERENCE TO RELATED APPLICATIONS

This application is a continuation of and claims the benefit under 35 U.S.C. § 120 of U.S. patent application Ser. No. 13/978,175, titled "SIGNAL PROCESSING DEVICE, METHOD, AND PROGRAM," filed on Jul. 3, 2013, which is a U.S. National Stage Application under 35 U.S.C. § 371 of International Application No. PCT/JP2012/050173, filed on Jan. 6, 2012, which claims priority to Japanese Priority Patent Application JP 2011-006233 filed on Jan. 14, 2011. The entire contents of these applications are hereby incorporated by reference in their entireties.

TECHNICAL FIELD

The present invention relates to a signal processing device, method, and program, and particularly, relates to a signal processing device, program, and method that enables audio to be obtained at a higher audio quality in a case of decoding encoding audio signals.

BACKGROUND ART

In general, audio signal encoding methods such as HE-AAC (High Efficiency MPEG (Moving Picture Experts Group) 4 AAC (Advanced Audio Coding)) (international standard ISO/IEC 14496-3) are known. With such an encoding method, a high frequency feature encoding technology such as SBR (Spectral Band Replication) is used (for example, refer to PTL 1).

According to SBR, when encoding audio signals, SBR information is output for generating high frequency components of the audio signal (hereafter, referred to as high frequency signal) together with low frequency components of the encoded audio signal (hereafter, low frequency signal). At the decoding device, while decoding the encoded low frequency signal, the high frequency signal is generated by using the low frequency signal obtained by the decoding and the SBR information, and so the audio signal made up of the low frequency signal and the high frequency signal is obtained.

This kind of SBR information includes envelope information mainly representing an envelope form for the high frequency components, and noise envelope information representing for obtaining a noise signal added during the generation of the high frequency components at the decoding device.

Here, the noise envelope information includes information representing a boundary position for dividing each SBR frame of the noise signal included in the high frequency components into two zones (hereafter, referred to as the noise boundary position), and information representing gain of noise signals in each zone. Therefore, at the decoding device, a gain adjustment is performed on each zone divided by the noise boundary position on a predetermined noise signal on the basis of the noise envelope information to establish a final noise signal. Further, with SBR, it is also possible to set the gain on the entire SBR frame without dividing the SBR frame of the noise signal into two zones.

When decoding the audio signal, the decoding device generates the high frequency components by combining a pseudo high frequency signal obtained from the low frequency signal and the envelope information, and the noise signal obtained from the noise envelope information, and generates the audio signal from the obtained high frequency components and the low frequency signal.

Also, with SBR, an encoding using sine wave synthesis is performed on an audio signal with a high tone characteristic. That is to say, when generating the high frequency components at the decoding side, a sine wave signal of a particular frequency is added to the pseudo high frequency signal in addition to the noise signal. In this case, the signal obtained from combining the pseudo high frequency signal, the noise signal, and the sine wave signal is set to the high frequency signal obtained as a prediction.

When using a sine wave signal to predict the high frequency components, a sine wave information representing the existence/non-existence of the sine wave signal in the SBR frame is included in the SBR information. Specifically, the combination start position of the sine wave signal used during decoding is either the start position of the SBR frame or the noise boundary position, and the sine wave information is made up of binary information representing the existence/non-existence of a sine wave signal combination in each zone of the SBR frame divided by the noise boundary position.

In this way, the noise signal and the sine wave signal added to the pseudo high frequency signal are components that are difficult to reproduce from the envelope information within the high frequency components of the source audio signal. Therefore, by combining the noise signal and the sine wave signal at a suitable position in the pseudo high frequency signal, it is possible to predict the high frequency components with higher accuracy, and it is possible to reproduce audio at a higher audio quality by performing band pass expansion using the high frequency components obtained by prediction.

CITATION LIST

Patent Literature

PTL 1: Japanese Unexamined Patent Application Publication (Translation of PCT Application) No. 2001-521648

SUMMARY OF INVENTION

Technical Problem

However, when using a sine wave signal to predict the high frequency components, the combination start position of the sine wave signal is set as the SBR frame start position or the noise boundary position, which may cause variance in the emergence start position of the sine wave components in the original audio signal, in some cases. Thus, it is not possible to reproduce the high frequency components with high accuracy, and may cause degradation in the audible perception of the audio signal obtained from the decoding.

Particularly with SBR, the frame length is fixed and not dependent on the sampling rate of the audio signal to be encoded, and so when the sampling rate is low, the absolute time length for one frame becomes longer. For this reason, the amount of variance (difference) in absolute time between the emergence start position of the sine wave components in the source audio signal and the combination start position of the sine wave signal to be combined during decoding increases, and quantization noise becomes noticeable at these zones of variance.

The present technology has been made taking this kind of situation into consideration to enable the obtainment of audio at a higher audio quality when decoding audio signals.

Solution to Problem

A signal processing device of a first aspect of the present invention is provisioned with an extracting unit configured to extract an envelope information representing low frequency components of an audio signal and an envelope of high frequency components of the audio signal and a sine wave information used for identifying the frequency and emergence position of sine wave components included in the high frequency components, a pseudo high frequency generating unit configured to generate a pseudo high frequency signal configuring the high frequency components on the basis of the low frequency signal as the low frequency component and the envelope information, a sine wave generating unit configured to generate a sine wave signal at a frequency represented by the sine wave information and which designates the emergence position identified from the sine wave information as the start position, and a combining unit configured to combine the low frequency signal, the pseudo high frequency signal, and the sine wave signal to generate the audio signal.

The sine wave information may include information representing the distance from the start position of a frame of the high frequency component until the emergence start position of the sine wave component as information used for identifying the emergence position.

The signal processing device is further provisioned with a noise generating unit configured to generate a noise signal configuring the high frequency components by adjusting the gain of each zone of a predetermined signal, in which the zones are divided by a noise boundary position represented by a noise envelope information, on the basis of information representing the gain of each zone represented by the noise envelope information, wherein the extracting unit further extracts the noise envelope information, the sine wave information includes information representing the distance from the noise boundary position until the emergence start position of the sine wave components as the information used for identifying the emergence position, and the combining unit may combines the low frequency signal, the pseudo high frequency signal, the sine wave signal, and the noise signal to generate the audio signal.

The sine wave information may include information representing the distance from a peak position of the high frequency component envelope until the emergence start position of the sine wave component as the information used for identifying the emergence position.

The sine wave information may be extracted for each frame, and the sine wave generating unit may generate the sine wave signal for the high frequency components of each frame.

The sine wave information may be extracted for each band configuring the high frequency components, and the sine wave generating unit may generate the sine wave signal for each band.

A signal processing method or program of the first aspect of the present invention includes the steps of extracting the low frequency components of the audio signal, the envelope information representing the envelope of the high frequency component of the audio signal, and the sine wave information used for identifying the frequency and emergence start position of the sine wave component included in the high frequency components, generating the pseudo high frequency signal configuring the high frequency components on the basis of a low frequency signal as the low frequency component and the envelope information, generating a sine wave signal at the frequency represented by the sine wave information at a start position identified by the emergence start position from the sine wave information, and combining the low frequency signal, the pseudo high frequency signal, and the sine wave signal to generate the audio signal.

Regarding the first aspect of the present invention, the envelope information representing low frequency components of an audio signal and an envelope of high frequency components of the audio signal and sine wave information used for identifying the frequency and emergence position of sine wave components included in the high frequency components are extracted, a pseudo high frequency signal configuring the high frequency components is generated on the basis of the low frequency signal as the low frequency component and the envelope information, a sine wave signal at a frequency represented by the sine wave information and which designates the emergence position identified from the sine wave information as the start position is generated, and the low frequency signal, the pseudo high frequency signal, and the sine wave signal are combined to generate the audio signal.

A signal processing device of a second aspect of the present invention is provisioned with an envelope information generating unit configured to generate envelope information representing an envelope of a high frequency signal, which is the high frequency component of an audio signal, a sine wave information generating unit configured to detect a sine wave signal included in the high frequency signal, and generating a sine wave information used for identifying the frequency and emergence position of the sine wave signal, and an output unit configured to generate and output data made up from a low frequency signal, which is a low frequency component of the audio signal, the envelope information, and the sine wave information.

The sine wave information may include information representing the distance from the start position of a frame of the high frequency component until the emergence start position of the sine wave signal as information used for identifying the emergence position.

The signal processing device is further provisioned with a noise envelope information generating unit configured to detect a noise signal included in the high frequency signal, and generating a noise envelope information made up from information representing a noise boundary position which divides the noise signal into multiple zones and information representing the gain of the noise signal in the zone, wherein the sine wave information includes information representing the distance from the noise boundary position until the emergence start position of the sine wave components as the information used for identifying the emergence position, and the output unit may generate and output data made up from the low frequency signal, the envelope information, the sine wave information, and the noise envelope information.

The sine wave information may include information representing the distance from a peak position of the high frequency component envelope until the emergence start position of the sine wave component as the information used for identifying the emergence position.

The sine wave information may be generated for each frame.

The sine wave information may be generated for each band configuring the high frequency components.

A signal processing method or program of the second aspect of the present invention includes the steps of generating envelope information representing an envelope of a high frequency signal, which is the high frequency component of an audio signal, generating sine wave information included in the high frequency signal is detected, and a sine wave information used for identifying the frequency and emergence position of the sine wave signal, and generating and outputting data made up from a low frequency signal, which is the low frequency component of the audio signal, the envelope information, and the sine wave information.

Regarding the second aspect of the present invention, envelope information representing an envelope of a high frequency signal, which is a high frequency component of an audio signal, is generated, a sine wave signal included in the high frequency signal is detected, and a sine wave information used for identifying the frequency and emergence position of the sine wave signal is generated, and data made up from a low frequency signal, which is a low frequency component of the audio signal, the envelope information, and the sine wave information is generated and output.

Advantageous Effects of Invention

According to the first aspect and the second aspect of the present technology, audio may be obtained at a higher audio quality when decoding an audio signal.

DESCRIPTION OF EMBODIMENTS

Hereafter, the embodiments applying the present technology will be described with reference to the drawings.

First Embodiment

Figure 1:
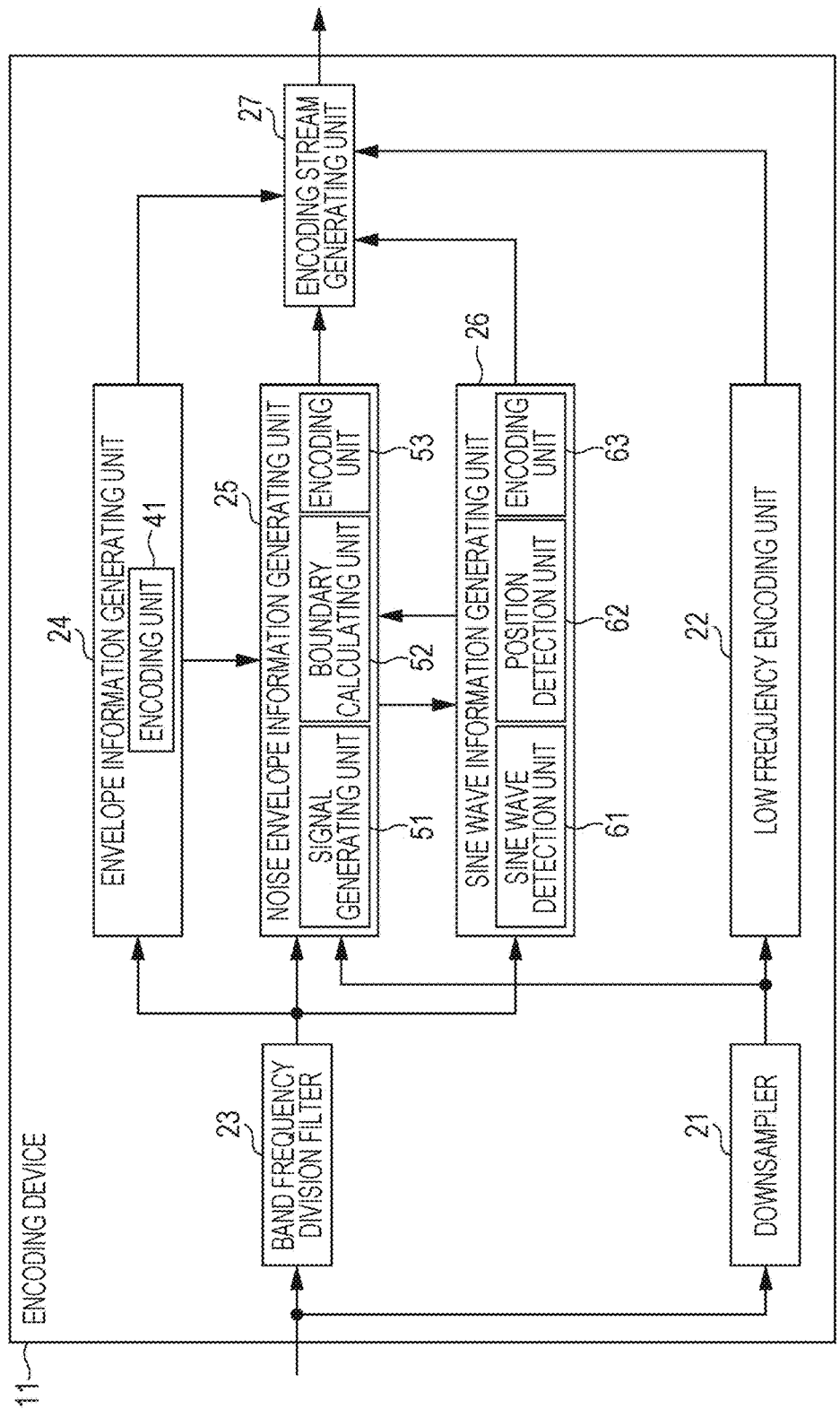
FIG. 1 is a diagram illustrating a configuration example of a first Embodiment of an encoding device.

[Configuration Example of Encoding Device]
FIG. 1 is a diagram illustrating a configuration example of a first Embodiment of an encoding device applying the present technology.

An encoding device 11 is configured with a downsampler 21, a low frequency encoding unit 22, a band pass division filter 23, an envelope information generating unit 24, a noise envelope information generating unit 25, a sine wave information generating unit 26, and an encoding stream generating unit 27. The encoding device 11 encodes and outputs an input audio signal, and the audio signal input into the encoding device 11 is supplied to the downsampler 21 and the band pass division filter 23.

The downsampler 21 extracts the low frequency signal, which is the low frequency components of the audio signal, by downsampling the input audio signal, and supplies this to the low frequency encoding unit 22 and the noise envelope information generating unit 25. Further, hereafter, the frequency band components at or below a certain frequency of the audio signal are referred to as the low frequency components, and the frequency band components higher than the low frequency components of the audio signal are referred to as the high frequency components.

The low frequency encoding unit 22 encodes the low frequency signal supplied from the downsampler 21, and supplies this to the encoding stream generating unit 27.

The band pass division filter 23 conducts a filter processing on the input audio signal, and performs a band pass division of the audio signal. As a result of this band pass division, the audio signal is divided into a signal of multiple band components. Further, hereafter, each band signal configuring the high frequency components from within each band signal obtained by the band pass division is referred to as the high frequency signal. The band pass division filter 23 supplies the high frequency signal from the high frequency side of each band obtained by the band pass division to the envelope information generating unit 24, the noise envelope information generating unit 25, and the sine wave information generating unit 26.

The envelope information generating unit 24 generates an envelope information representing a form of an envelope (envelope) for the high frequency signal of the band for each band on the high frequency side on the basis of the high frequency signal supplied from the band pass division filter 23, and then supplies this to the noise envelope information generating unit 25. Also, the envelope information generating unit 24 is provisioned with an encoding unit 41, and the encoding unit 41 encodes the envelope information generated by the envelope information generating unit 24, and supplies this to the encoding stream generating unit 27.

The noise envelope information generating unit 25 generates a noise envelope information while receiving information from the sine wave information generating unit 26 as necessary, on the basis of the high frequency signal from the band pass division filter 23 and the envelope information from the envelope information generating unit 24.

Here, the noise envelope information is information made up from information representing a boundary position (noise boundary position) for dividing the noise signal included in the high frequency components of the audio signal, and information representing the noise signal gain for each zone divided at the noise boundary position. Further, the noise signal is a previously determined signal.

Also, the noise envelope information generating unit 25 is provisioned with a signal generating unit 51, a boundary calculating unit 52, and an encoding unit 53. When generating noise envelope information, the signal generating unit 51 predicts the high frequency side of the audio signal for each band component on the basis of the low frequency signal from the downsampler 21 and the envelope information from the envelope information generating unit 24.

The boundary calculating unit 52 determines the noise boundary position used for dividing the noise signal into multiple zones on the basis of the noise signal envelope obtained from the high frequency signal and a pseudo high frequency signal, which is the result of the high frequency side of each band pass component predicted during the generation of the noise envelope information. The encoding unit 53 encodes the noise envelope information generated by the noise envelope information generating unit 25, and supplies this to the encoding stream generating unit 27.

The sine wave information generating unit 26 generates sine wave information used for obtaining the sine wave signal included in the band for each band at the high frequency side while receiving the information from the noise envelope information generating unit 25 as necessary, on the basis of the high frequency signal supplied from the band pass division filter 23.

Here, the sine wave information is information made up from information representing the existence/non-existence of a sine wave signal included in the high frequency components of the audio signal, and information used for identifying the emergence start position of the sine wave signal. That is to say, the sine wave information may be information made up from information representing the existence/non-existence of a sine wave signal to be combined with the pseudo high frequency components during decoding of the audio signal, and information representing the combination start position of the sine wave signal.

Also, then sine wave information generating unit 26 is provisioned with a sine wave detection unit 61, a position detection unit 62, and an encoding unit 63. The sine wave detection unit 61 detects the existence/non-existence of the sine wave components from the high frequency signal during generation of the sine wave information.

When generating sine wave information, the position detection unit 62 detects the combination start position indicating where the combination of the sine wave signal should start, that is to say, the emergence start position of the sine wave signal, on the basis of the high frequency signal from the band pass division filter 23. The encoding unit 63 encodes the sine wave information generated by the sine wave information generating unit 26, and supplies this to the encoding stream generating unit 27.

The encoding stream generating unit 27 encodes the low frequency signal from the low frequency encoding unit 22, the envelope information from the envelope information generating unit 24, the noise envelope information from the noise envelope information generating unit 25, and the sine wave information from the sine wave information generating unit 26, and outputs the encoding stream obtained from this encoding. That is to say, the low frequency signal, the envelope information, the noise envelope information, and the sine wave information are multiplexed into the encoding stream.

[Description of Encoding Processing]

Next, the operation of the encoding device 11 will be described.

When the audio signal is input into the encoding device 11, and instructed to encode the audio signal, the encoding device 11 performs the encoding processing to perform the encoding of the audio signal, and outputs the encoding stream obtained as the result. Hereafter, the encoding processing by the encoding device 11 will be described with reference to the flowchart in FIG. 2.

At a step S11, the downsampler 21 downsamples the input audio signal to generate the low frequency signal, and supplies this to the noise envelope information generating unit 25 and the low frequency encoding unit 22.

At a step S12, the low frequency encoding unit 22 encodes the low frequency signal supplied from the downsampler 21, and supplies this to the encoding stream generating unit 27. For example, the low frequency signal is encoded by an encoding method such as MPEG4 AAC, MPEG2 AAC, CELP (Code Exited Linear Prediction), TCX (Transform Coded Excitation), or AMR (Adaptive Multi-Rate).

At a step S13, the band pass division filter 23 divides the input audio signal into bands, and the high frequency components obtained as the result are supplied to the envelope information generating unit 24 through the sine wave information generating unit 26. For example, high frequency signals may be obtained as high frequency components from 64 different bands.

At a step S14, the envelope information generating unit 24 generates the envelope information for each band on the basis of the high frequency signal for each band supplied from the band pass division filter 23. For example, the envelope information generating unit 24 may designate a zone made up of 32 samples of the high frequency signal as one frame, and generate the envelope information for each band per frame.

Specifically, the envelope information generating unit 24 obtains an average sample value of two samples of the high frequency signal neighboring on a time line in one frame, and this average value becomes the new high frequency signal sample value. As a result, the high frequency signal for one frame is converted from a 32-sample signal to a 16-sample signal.

Next, the envelope information generating unit 24 performs a difference encoding on the high frequency signal that is now 16 samples, and the information obtained as the result becomes the envelope information. For example, the difference between the sample value of two high frequency signal samples to be processed neighboring on a time line is obtained by the difference encoding, and this difference becomes the envelope information. Also, the envelope information may be made up of the difference between the sample value of a sample of the high frequency signal of the band to be processed and the sample value of a sample in a band adjacent to that band, in the same position as the high frequency signal band, for example.

The envelope information obtained in this way is the information representing the form of the envelope for one frame of the high frequency signal. The encoding unit 41 performs a variable length encoding such as Huffman encoding on the generated envelope information, and supplies the encoded envelope information to the encoding stream generating unit 27. Also, the envelope information generating unit 24 supplies the envelope information to the noise envelope information generating unit 25.

Further, hereafter, the high frequency signal will continue to be described as that processed in units of one frame configured of 32 samples. Also, hereafter, the zone configured from two samples of the high frequency signal (audio signal) will be called one timeslot.

At a step S15, the signal generating unit 51 in the noise envelope information generating unit 25 generates the pseudo high frequency signal for each band at the high frequency side on the basis of the envelope information supplied from the envelope information generating unit 24 and the low frequency signal supplied from the downsampler 21.

For example, the signal generating unit 51 extracts the zone for one frame of a predetermined band of the low frequency signal, and manipulates the extracted low frequency signal into the envelope form represented by the envelope information. That is to say, the sample value of the sample of the low frequency signal is increased or decreased so that the position gain corresponding to the sample fits in the envelope represented by the envelope information, and the signal obtained as the result becomes the pseudo high frequency signal.

The pseudo high frequency signal obtained in this way has the almost the same envelope form as the envelope of the actual high frequency signal represented by the envelope information. That is to say, the pseudo high frequency signal is generated from the low frequency signal and the envelope information.

At a step S16, the noise envelope information generating unit 25 extracts the difference between the high frequency signal and the pseudo high frequency signal for each band at the high frequency side, and obtains the envelope for the noise signal (hereafter, referred to as the noise envelope).

Further, more specifically, the noise envelope obtained at step S16 is a virtual noise envelope. The receiving side of the encoding stream output from the encoding device 11 predicts the high frequency components of the audio signal during the decoding of the audio signal, but this prediction is performed by combining of the pseudo high frequency signal, the noise signal, and the sine wave signal.

That is to say, the high frequency components of the actual audio signal are assumed to include the pseudo high frequency signal, the noise signal, and the sine wave signal. Here, at the step S16, the difference between the high frequency signal and the pseudo high frequency signal is obtained, and this difference should be the combination of the noise signal and the sine wave signal. Thus, the difference obtained in this way is considered as the envelope of the noise signal including the sine wave signal.

The noise envelope information generating unit 25 supplies the virtual noise envelope for each band at the high frequency side obtained as previously described to the sine wave information generating unit 26.

At a step S17, the sine wave detection unit 61 in the sine wave information generating unit 26 detects the sine wave components from the high frequency signal for each band on the basis of the virtual noise envelope supplied from the noise envelope information generating unit 25.

For example, the sine wave detection unit 61 conducts a frequency conversion on the virtual noise envelope, and converts the noise envelope into frequency components. Then, when there are frequency spikes having high power in the obtained frequency components, the sine wave detection unit 61 recognizes these frequency components as the sine wave components. Specifically, when the difference between the power of the frequency under observation and the power of other surrounding frequencies is at or above a predetermined threshold, the frequency under observation is recognized as the sine wave component. The sine wave signal for the frequency detected in this way is determined as the sine wave signal included in the actual high frequency components.

At a step S18, the position detection unit 62 in the sine wave information generating unit 26 detects, for each band, the combination start position where the sine wave signal, which is the detected sine wave component, should be combined on the basis of the high frequency signal supplied from the band pass division filter 23.

For example, the position detection unit 62 obtains the difference between the average sample value of the samples included in one timeslot of the high frequency signal, in units of timeslots, and the average sample value of samples included in one timeslot of the detected sine wave signal. Then, the position detection unit 62 determines the combination start position looking from the beginning of the zone for one frame as the final position (start position of the timeslot or the final position of the sample) where the value of the obtained difference is at or above a predetermined threshold. This combination start position is the emergence start position of the sine wave signal included in the actual high frequency signals, from a timing after the combination start position, the difference in the average sample values of the high frequency signal and the sine wave signal should decrease.

Also, for each band at the high frequency side, the sine wave information generating unit 26 supplies the information representing whether or not the sine wave has been detected from the bands, the information representing the frequency and power of the detected sine wave signal, and the combination start position to the noise envelope information generating unit 25.

At a step S19, the sine wave information generating unit 26 generates the sine wave information for each band at the high frequency side, and supplies this to the encoding stream generating unit 27.

For example, the sine wave information generating unit 26 designates the information made up from the information representing whether or not the sine wave signal has been detected from the high frequency band and the combination start position as the sine wave information. Also, during the generation of the sine wave information, the encoding unit 63 in the sine wave information generating unit 26 performs the variable length encoding of the information representing the combination start position.

Here, the information representing whether or not the sine wave signal has been detected is, more specifically, information representing which frequency in the high frequency band is the sine wave component. For example, when multiple sine wave signals are detected from the high frequency band, the information used for identifying the frequencies of these sine wave signals is designated as the information representing whether or not the sine wave signals were detected. Also, when multiple sine wave signals are detected from the high frequency band, information representing the combination start position is generated for each sine wave signal.

Also, when the sine wave component is not detected from the high frequency band, the sine wave information made up only of information representing whether or not the sine wave signal has been detected is transmitted to the decoding side. That is to say, the sine wave information not including information representing the combination start position is transmitted.

Further, the encoding device 11 may select whether or not to transmit the sine wave information to the decoding side per frame. In this way, by enabling the transmission of the sine wave information to be selectable, transfer efficiency of the encoding stream in increased, and at the same time, a resetting of the time information of the sine wave components may be performed. As a result, when starting the decoding processing from an arbitrary frame within the stream on the decoding side of the encoding stream, the sine wave component from the frame including the information representing the combination start position may be started.

Figure 3:
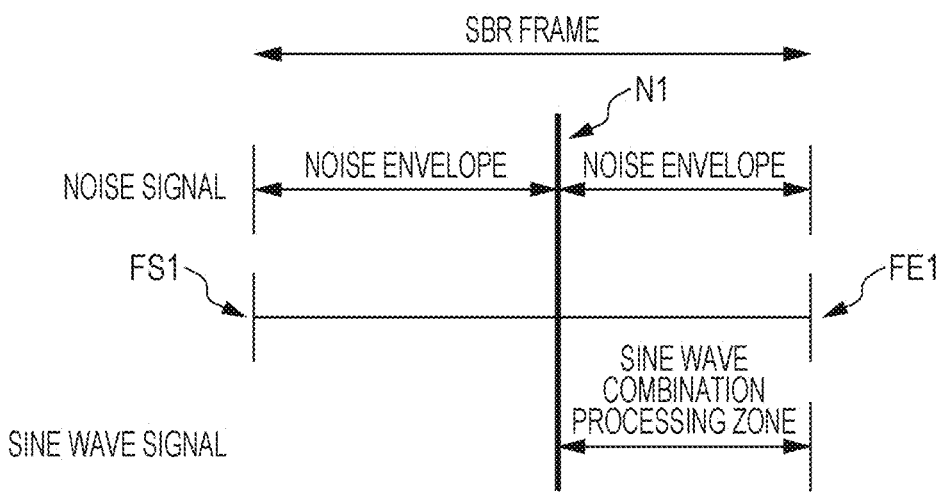
FIG. 3 is a diagram illustrating a combination start position of a sine wave signal.

Further, as illustrated in FIG. 3 for example, the combination start position on the decoding side has conventionally been either the start position of the frame or the noise boundary position. Further, the horizontal axis in the figure represents the time line. Also, an arrow FS1 and an arrow FE1 in FIG. 3 represent the start position and end position of the frame, respectively.

According to the example in FIG. 3, the position represented by an arrow N1 is the noise boundary position, and the combination start position of the sine wave signal is also in the same position as the noise boundary position. Therefore, the sine wave signal is combined in a zone from the position represented by the arrow N1 until the end position of the frame.

However, when the position that sine wave signal included in the actual high frequency components arrives is after the noise boundary position represented by the arrow N1, for example, at the decoding side, unnecessary sine wave components are added in the space from the noise boundary position to the emergence start position of the actual sine wave signal. In this case, there is an unpleasant audible sensation in the audio signal obtained by the decoding, and audio at a high audio quality is unable to be obtained.

Figure 4:
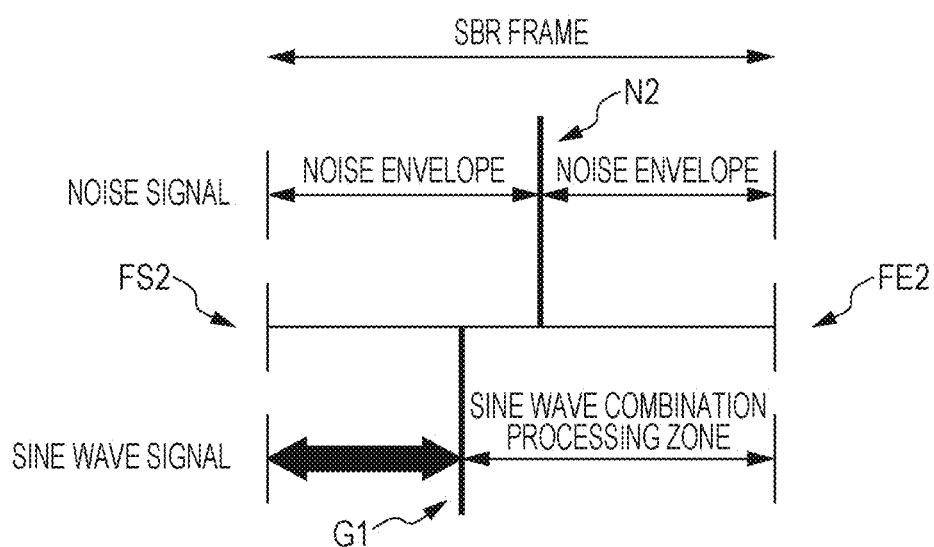
FIG. 4 is a diagram illustrating a combination start position of a sine wave signal.

Regarding this, as illustrated in FIG. 4, according to the encoding device 11, the combination start position output to the decoding side is not limited to being the same as the noise boundary position. Further, the horizontal axis in the figure represents the time line. Also, an arrow FS2 and arrow FE2 in FIG. 4 represent the start position and the end position of the frame, respectively.

According to the example in FIG. 4, the position represented by an arrow N2 represents the noise boundary position. Also, the combination start position of the sine wave signal is the position represented by an arrow G1, and this combination start position is before the noise boundary position. According to this example, the sine wave signal is combined in the zone from the combination start position represented by the arrow G1 until the end position of the frame.

Also, in this case, the information representing the length of time (time distance) from the start position of the frame represented by the arrow FS2 until the combination start position represented by the arrow G1 is designated as the information representing the combination start position. Here, the time from the beginning of the frame until the combination start position is an integral multiple of the timeslot length.

In this way, by specifying the combination start position independent of the noise boundary position, the combination of unnecessary signals is prevented during the decoding of the audio signal, and audio at a higher audio quality may be obtained.

Further, the sine wave information has been previously described as information generated representing the combination start position for the high frequency side for each band, but the sine wave information may use a representative value of the combination start positions for these bands shared for each band configuring the high frequency. In such a case, for example, the information representing the combination start position for the band out of multiple bands configuring the high frequency which has the sine wave signal of the highest power becomes the sine wave information.

Also, the information representing the combination start position has been described above as the sine wave information to which variable length encoding has been performed, but the information representing the combination start position may not be encoded.

Figure 2:
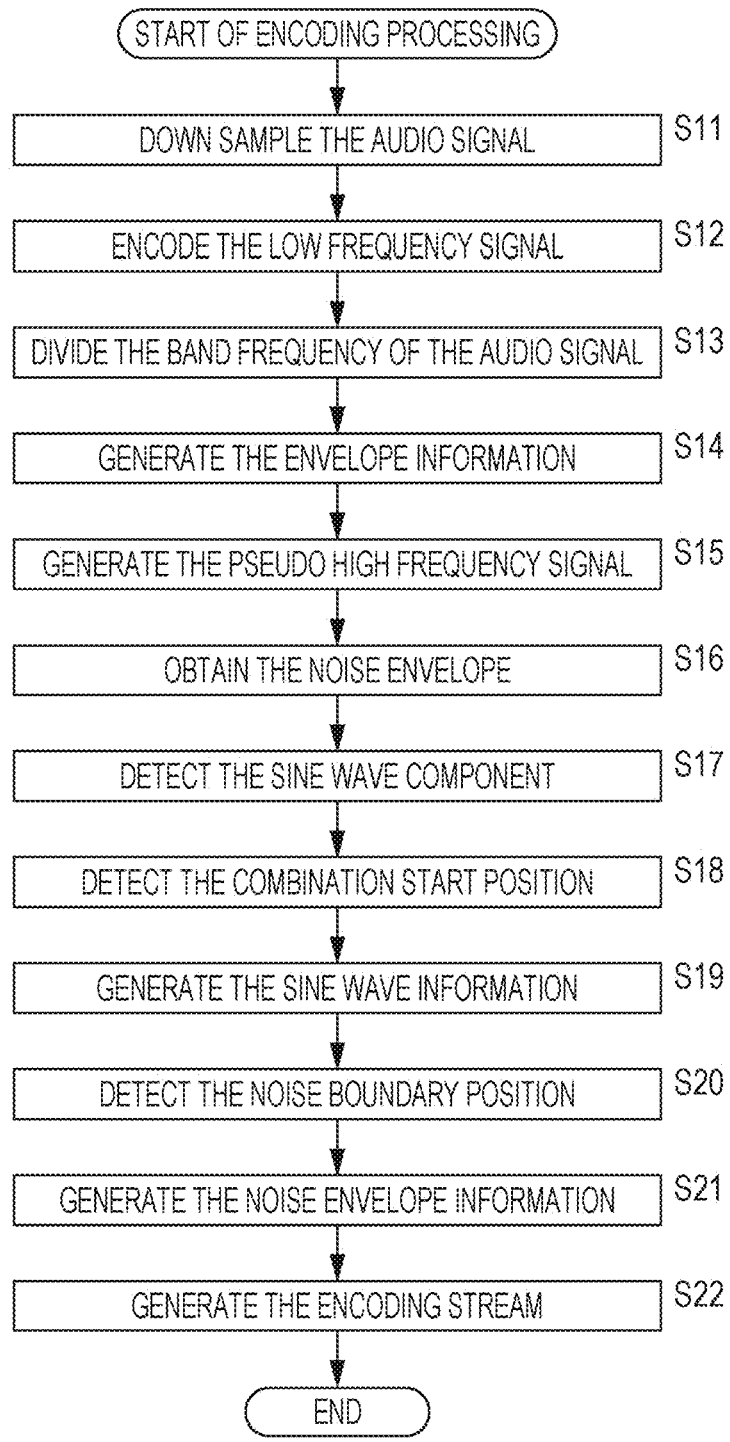
FIG. 2 is a flowchart describing an encoding processing.

Returning to the description of the flowchart in FIG. 2, at the step S19, the sine wave information is generated, and afterwards, processing proceeds to a step S20.

At a step S20, the boundary calculating unit 52 in the noise envelope information generating unit 25 detects the noise boundary position for each band at the high frequency side.

For example, the boundary calculating unit 52 generates the sine wave information included in the frame for the band configuring the high frequency on the basis of the information representing whether or not the sine wave signal has been detected, the information representing the frequency and power of the sine wave signal, and the combination start position. For example, when the sine wave signal is detected, the zone from the beginning of the frame until the combination start position is designated as a silent zone, and the zone from this point is made up of the sine wave component of a predetermined amplitude of the detected frequency. At this time, the amplitude of the sine wave signal is determined from the information representing the power of the sine wave signal supplied from the sine wave information generating unit 26. Also, when the sine wave signal is not detected, the amplitude of the sine wave signal is set to zero.

Next, the boundary calculating unit 52 subtracts the sine wave signal obtained in this way from the virtual noise envelope obtained at a step S16 to obtain the final noise envelope. Then, the boundary calculating unit 52 determines the noise boundary position according to the distribution of the final noise envelope gain.

That is to say, the boundary calculating unit 52 divides the frame into two zones as necessary based on the distribution of the gain of the final noise envelope. Specifically, when the noise envelope gain is nearly the same value for the entire frame of the band being processed, the division of the frame is not performed. That is to say, there is no noise boundary position.

Also, when there is a large difference in the gain distribution of the noise envelope at a predetermined position in the frame for the zone before this position and the zone after this position, this position becomes the noise boundary position. Further, the noise boundary position is designated as the timeslot boundary position.

At a step S21, the noise envelope information generating unit 25 generates the noise envelope information for each band at the high frequency side, and supplies this to the encoding stream generating unit 27.

For example, the noise envelope information generating unit 25 designates the noise envelope information as the information made up from the noise boundary position, and the noise signal gain in each zone in the frame divided by this noise boundary position. At this time, the encoding unit 53 performs an encoding of the information representing the noise boundary position, and a variable length encoding of the information representing the gain for each divided zone.

Here, the gain for each divided zone is the average gain value of the noise envelope in these zones, for example. That is to say, the frame being processed is divided into two zones by the noise boundary position. In this case, the gain for the zone from the beginning of the frame until the noise boundary position is the average gain value for each position of the final noise envelope in this zone.

At a step S22, the encoding stream generating unit 27 encodes the low frequency signal from the low frequency encoding unit 22, the envelope information from the envelope information generating unit 24, the noise envelope information from the noise envelope information generating unit 25, and the sine wave information from the sine wave information generating unit 26, and generates the encoding stream. Then, the encoding stream generating unit 27 transmits the encoding stream obtained from the encoding to the decoding device, etc., and the encoding processing terminates.

In this way, the encoding device 11 generates and outputs the encoding stream made up from the low frequency signal, the envelope information, the noise envelope information, and the sine wave information. At this time, by a more accurate combination start position of the sine wave signal being detected, and generating the sine wave information including this combination start position, a more accurate sine wave signal combination may be performed at the decoding side of the audio signal, which results in the obtainment of audio at a higher audio quality.

Further, the low frequency signal generated by the downsampler 21 has been described above to be supplied to the noise envelope information generating unit 25, but the low frequency signal supplied to the noise envelope information generating unit 25 may be a low frequency signal obtained by division of the bands by the band pass division filter 23. Also, the low frequency signal encoded by the low frequency encoding unit 22 is obtained by decoding, but this may also be supplied to the noise envelope information generating unit 25.

[Configuration Example of Decoding Device]

Next, a decoding device which receives the encoding stream output from the encoding device 11 in FIG. 1, and obtains the audio signal from the encoding stream will be described. This kind of decoding device is configured as illustrated in FIG. 5, for example.

Figure 5:
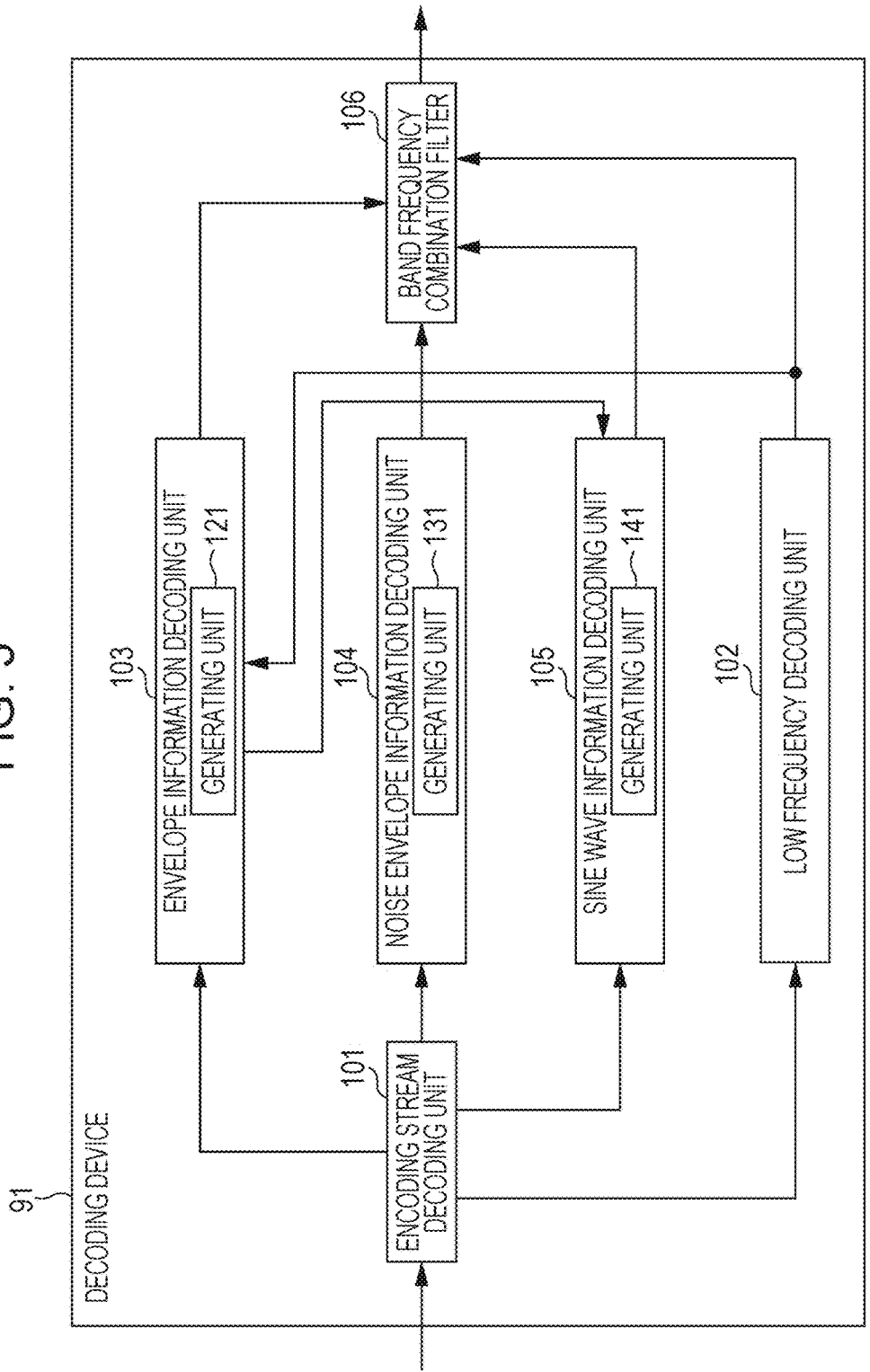
FIG. 5 is a diagram illustrating a configuration example of the first Embodiment of a decoding device.

A decoding device 91 in FIG. 5 is configured with an encoding stream decoding unit 101, a low frequency decoding unit 102, an envelope information decoding unit 103, a noise envelope information decoding unit 104, a sine wave information decoding unit 105, and a band pass combination filter 106.

The encoding stream decoding unit 101 receives and decodes the encoding stream transmitted from the encoding device 11. That is to say, the encoding stream decoding unit 101 inverse multiplexes the encoding stream, and the low frequency signal, the envelope information, the noise envelope information, and the sine wave information obtained as a result is supplied to the low frequency decoding unit 102, the envelope information decoding unit 103, the noise envelope information decoding unit 104, and the sine wave information decoding unit 105, respectively.

The low frequency decoding unit 102 decodes the low frequency signal supplied from the encoding stream decoding unit 101, and supplies this to the envelope information decoding unit 103 and the band pass combination filter 106.

The envelope information decoding unit 103 decodes the envelope information supplied from the encoding stream decoding unit 101, and also supplies the decoded envelope information to the sine wave information decoding unit 105. Also, the envelope information decoding unit 103 is provisioned with a generating unit 121, and the generating unit 121 generates envelop information and the pseudo high frequency signal based on the low frequency signal from the low frequency decoding unit 102, and supplies this to the band pass combination filter 106.

The noise envelope information decoding unit 104 decodes the noise envelope information supplied from the encoding stream decoding unit 101. Also, the noise envelope information decoding unit 104 is provisioned with a generating unit 131, and the generating unit 131 generates the noise signal based on the noise envelope information, and supplies this to the band pass combination filter 106.

The sine wave information decoding unit 105 decodes the sine wave information supplied from the encoding stream decoding unit 101. Also, the sine wave information decoding unit 105 is provisioned with a generating unit 141, and the generating unit 141 generates the sine wave signal based on the sine wave information and envelope information from the envelope information decoding unit 103, and supplies this to the band pass combination filter 106.

The band pass combination filter 106 combines the bands of the low frequency signal from the low frequency decoding unit 102, the pseudo high frequency signal from the envelope information decoding unit 103, the noise signal from the noise envelope information decoding unit 104, and the sine wave signal from the sine wave information decoding unit 105 to generate the audio signal. The band pass combination filter 106 outputs the signal obtained from combining the bands as the decoded audio signal to a downstream player unit or similar.

[Description of Decoding Processing]

When the encoding stream from the encoding device 11 is transmitted to the decoding device 91 illustrated in FIG. 5, the decoding device 91 performs the decoding processing in units of frames to decode the audio signal. Hereafter, the decoding processing performed by the decoding device 91 will be described with reference to FIG. 6.

At a step 51, the encoding stream decoding unit 101 decodes the encoding stream received from the encoding device 11, and supplies the low frequency signal, envelope information, noise envelope information, and sine wave information obtained as a result to the low frequency decoding unit 102 through the sine wave information decoding unit 105.

At a step S52, the low frequency decoding unit 102 decoded the low frequency signal from the encoding stream decoding unit 101, and supplies this to the envelope information decoding unit 103 and the band pass combination filter 106.

At a step S53, the envelope information decoding unit 103 decodes the envelope information from the encoding stream decoding unit 101. Also, the envelope information decoding unit 103 supplies the decoded envelope information to the sine wave information decoding unit 105.

At a step S54, the generating unit 121 in the envelope information decoding unit 103 generates the pseudo high frequency signal for each band at the high frequency side, on the basis of the low frequency signal from the low frequency decoding unit 102, and supplies this to the band pass combination filter 106. For example, the generating unit 121 generates the pseudo high frequency signal by extracting the zone for one frame regarding a predetermined band of the low frequency signal, and increasing or decreasing the low frequency signal so that the sample value of the extracted low frequency signal sample matches the gain of the position in the envelope represented by the envelope information corresponding to this sample.

At a step S55, the noise envelope information decoding unit 104 decodes the noise envelope information from the encoding stream decoding unit 101.

At a step S56, the generating unit 131 in the noise envelope information decoding unit 104 generates the noise signal for each band at the high frequency side, on the basis of the noise envelope information, and supplies this to the band pass combination filter 106. That is to say, the generating unit 131 generates the noise signal by adjusting the gain for each zone of a predetermined signal which has been divided into zones by the noise boundary position represented by the noise envelope information so that the gain of this signal matches the gain represented by the noise envelope information.

At a step S57, the sine wave information decoding unit 105 decodes the sine wave information from the encoding stream decoding unit 101. For example, the information representing the combination start position included in the sine wave information is decoded as necessary.

At a step S58, the sine wave information decoding unit 105 performs the sine wave signal generation processing to generate the sine wave signal for each band at the high frequency side, and supplies this to the band pass combination filter 106. Further, the details of the sine wave signal generation processing will be described later.

At a step S59, the band pass combination filter 106 combines the bands of the low frequency signal from the low frequency decoding unit 102, the pseudo high frequency signal from the envelope information decoding unit 103, the noise signal from the noise envelope information decoding unit 104, and the sine wave signal from the sine wave information decoding unit 105.

That is to say, the audio signal is generated by performing the band combination by adding the samples at each timing from the low frequency signal, the pseudo high frequency signal for each band, the noise signal for each band, and the sine wave signal for each band input from the low frequency decoding unit 102 through the sine wave information decoding unit 105. Here, the signal made up of the pseudo high frequency signal, the noise signal, and the sine wave signal is the high frequency component obtained by prediction.

When the audio signal has been obtained by the band combination, the band pass combination filter 106 outputs this audio signal to a downstream player unit or similar, and the decoding processing terminates. This decoding processing is performed per frame, and as the next frame of the encoding stream is input, the decoding device 91 performs the decoding processing on this frame of the encoding stream.

In this way, the decoding device 91 predicts the high frequency components on the basis of the low frequency signal, the envelope information, the noise envelope information, and the sine wave information, and generates the audio signal by expanding the bands from the high frequency signal obtained by prediction and the decoded low frequency signal. At this time, by using the sine wave information representing a more accurate combination start position of the sine wave signal, a more accurate sine wave signal combination may be performed, and so audio at a higher audio quality may be obtained.

[Description of the Sine Wave Signal Generation Processing]

Next, the sine wave signal generation processing corresponding to step S58 of the processing in FIG. 6 will be described with reference to the flowchart in FIG. 7.

At a step S81, the generating unit 141 in the sine wave information decoding unit 105 determines whether or not the start timing for the sine wave signal combination processing has passed based on the combination start position and the information included in the sine wave information representing whether or not the sine wave signal has been detected.

For example, the generating unit 141 generates the sine wave signal as the sine wave component configuring the high frequency component by designating the beginning of the frame as the emergence start position and the end of the frame as the emergence end position.

Here, the frequency of the sine wave signal designated as the sine wave component configuring the high frequency component is identified by the information included in the sine wave information representing whether or not the sine wave signal has been detected. Also, the amplitude of the sine wave signal frequency identified by the sine wave information is identified from the envelope information supplied from the envelope information decoding unit 103 through the sine wave information decoding unit 105. For example, the generating unit 141 converts the envelope information into frequencies, and obtains the amplitude of the sine wave signal based on the power of the sine wave signal frequency from among the power of all frequencies obtained as a result.

Next, the generating unit 141 selects the sample in the start position of the timeslot for one frame of the sine wave signal as the sample (timeslot) to be processed in order from the beginning of the frame. Then, the generating unit 141 determines whether or not the selected sample position is the sample position represented by the combination start position, that is to say the timing at which the combination of the sine wave signal should be started. For example, when information included in the sine wave information indicates that the sine wave signal has not been detected, this will continue to be determined that the start timing of the sine wave combination processing has not passed.

When it has been determined that the start timing has not passed at the step S81, at a step S82, the generating unit 141 shifts the generated sine wave signal backward on a timeline by one timeslot. As a result, the emergence start position of the sine wave signal is shifted backward on a timeline. When the shifting of the sine wave signal is performed, the sine wave has not yet emerged in the timeslot zone to be processed, and so the sine wave signal is not output from the sine wave information decoding unit 105 to the band pass combination filter 106.

At a step S83, the generating unit 141 determines whether or not the end of one frame has been reached. For example, when the zone for the final timeslot configuring the frame is being processed, that is to say, when all timeslots in the frame have been processed, this is determined that the end of the frame has been reached.

When it has been determined that the end of the frame has not been reached at the step S83, the next timeslot is selected as that to be processed, the processing returns to step S81, and the previously described processing repeats. In this case, the shift processing, etc. is performed on the sine wave signal already generated.

Figure 6:
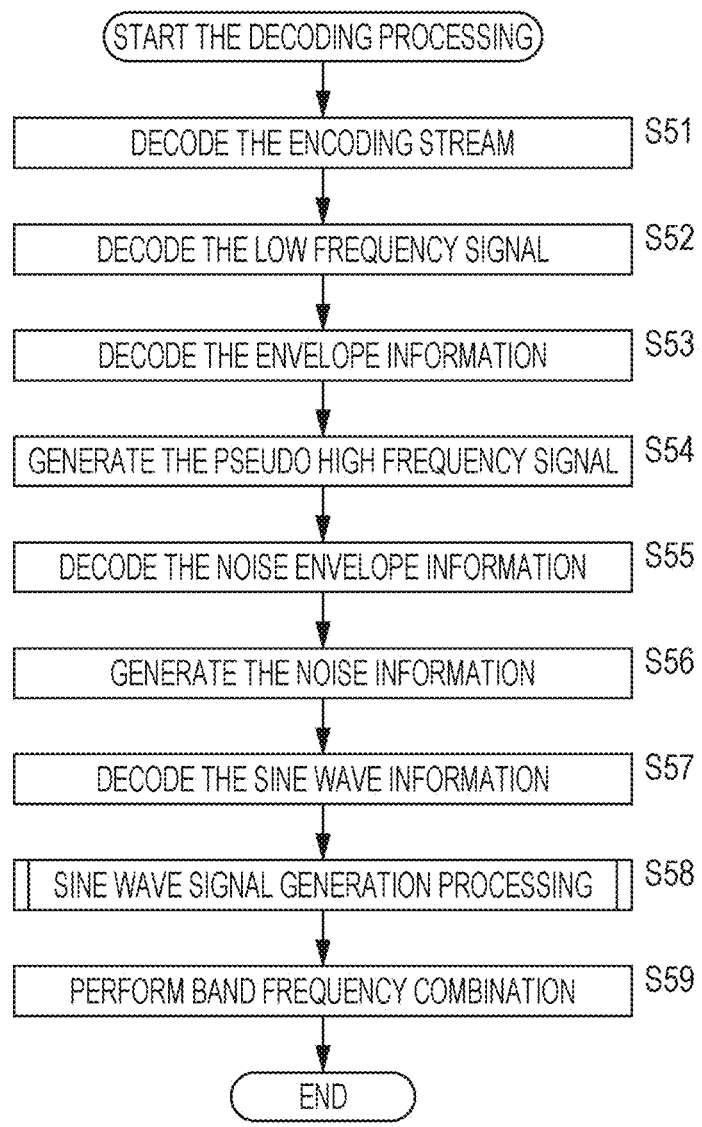
FIG. 6 is a flowchart describing a decoding processing.

Conversely, when it has been determined that the end of the frame has been reached at the step S83, the sine wave signal generation processing terminates, and afterwards, the processing proceeds to a step S59 in FIG. 6. In this case, the result is that the sine wave signal combination is not performed.

Also, when it has been determined that the start position of the sine wave combination processing has passed at the step S81, at a step S84, the generating unit 141 performs the sine wave combination processing. That is to say, the generating unit 141 outputs to the band pass combination filter 106 the sample value configuring the timeslot being processed of the sine wave signal which has been arbitrarily shift processed. As a result, the sample value of the output sine wave signal sample is combined with the low frequency signal as the sine wave component configuring the high frequency component.

At a step S85, the generating unit 141 determines whether or not the end of one frame has been reached. For example, when the zone for the final timeslot configuring the frame is being processed, that is to say, when all timeslots in the frame have been processed, this is determined that the end of the frame has been reached.

When it has been determined that the end of the frame has not been reached at the step S85, the next timeslot is selected as that to be processed, the processing returns to step S84, and the previously described processing repeats. Conversely, when it has been determined that the end of the frame has been reached at the step S85, the sine wave signal generation processing terminates, and afterwards, the processing proceeds to the step S59 in FIG. 6.

In this way, the sine wave information decoding unit 105 shifts the emergence start position of the sine wave signal to the combination start position on the basis of the sine wave information, and outputs the shifted sine wave signal. As a result, the combination of the sine wave is started at a more accurate position in one frame, and so audio at a higher audio quality may be obtained.

Second Embodiment

[Configuration Example of Encoding Device]

Though it has been described above that the combination start position representing the time (number of samples) from the beginning position of the frame until the position at which the combination of the sine wave signal should start is included in the sine wave information, information of the difference between the combination start position and the noise boundary position may be included.

Figure 8:
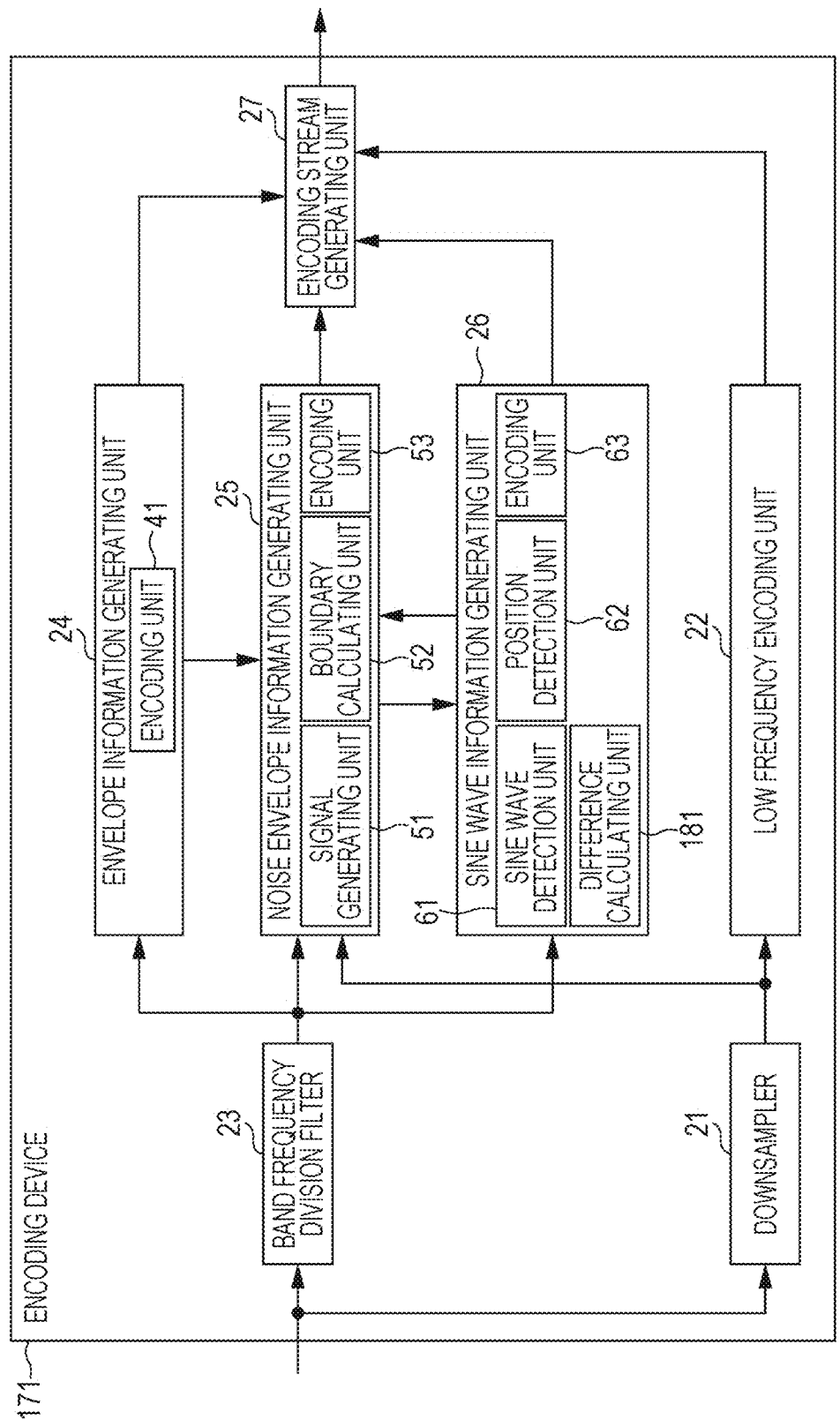
FIG. 8 is a diagram illustrating a configuration example of another encoding device.

In this case, the encoding device is configured as illustrated in FIG. 8. Further, the components in FIG. 8 that correspond to those in FIG. 1 have the same reference numerals, and so their descriptions will be omitted as appropriate. An encoding device 171 in FIG. 8 and the encoding device 11 are different in that a difference calculating unit 181 is newly provisioned in the sine wave information generating unit 26 of the encoding device 171, and so are the same regarding other components.

The difference calculating unit 181 in the sine wave information generating unit 26 calculates the difference between the combination start position of the sine wave signal detected by the position detection unit 62 and the noise boundary position. The sine wave information generating unit 26 supplies information made up from the difference information representing the difference with the noise boundary position calculated by the difference calculating unit 181 and the information representing whether or not the sine wave signal has been detected to the encoding stream generating unit 27 as the sine wave information.

[Description of Encoding Processing]

Next, the encoding processing performed by the encoding device 171 will be described with reference to the flowchart in FIG. 9. Further, the processing of the step S111 through the step S118 are the same as the step S11 through the step S18 in FIG. 2, and so their description is omitted.

At a step S119, the boundary calculating unit 52 in the noise envelope information generating unit 25 detects the noise boundary position for each band at the high frequency side. Then, at a step S20, the noise envelope information generating unit 25 generates the noise envelope information for each band at the high frequency side, and supplies this to the encoding stream generating unit 27. Further, at the step S119 and step S120, the same processing as at step S20 and step S21 in FIG. 2 is performed.

At a step S121, the difference calculating unit 181 in the sine wave information generating unit 26 calculates the difference between the noise boundary position and the combination start position of the sine wave signal detected by the position detection unit 62.

Figure 10:
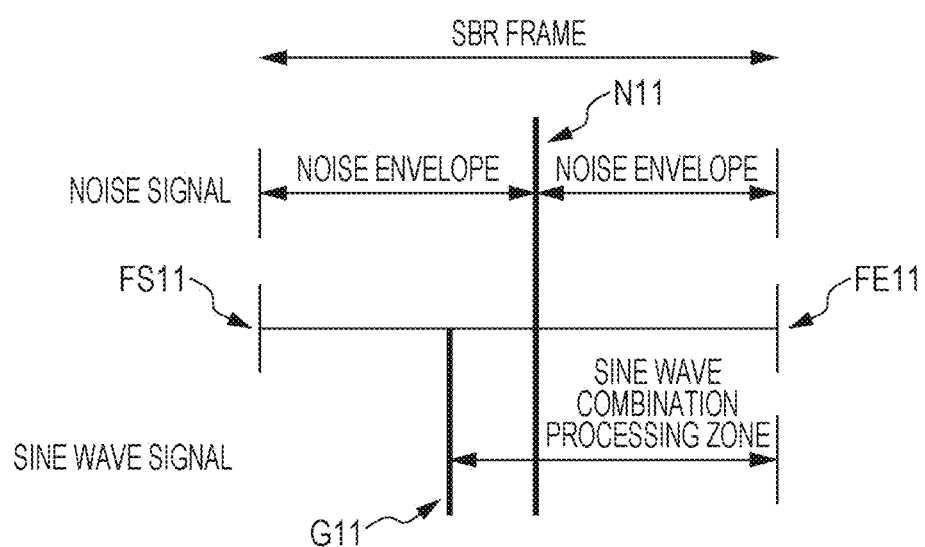
FIG. 10 is a diagram describing a combination start position of the sine wave signal.

For example, as illustrated in FIG. 10, the time (number of samples) from the start position of the sine wave combination until the noise boundary position is calculated as the difference. Further, the horizontal axis in the figure represents the timeline. Also, an arrow FS11 and an arrow FE11 in FIG. 10 represent the start position and the end position of the frame, respectively.

According to the example in FIG. 10, the position represented by an arrow N11 in the frame represents the noise boundary position. Also, the combination start position of the sine wave signal is the position represented by an arrow G11, and the combination start position is positioned before the noise boundary position. Therefore, the sine wave signal is combined in the zone from the combination start position represented by the arrow G11 until the end position of the frame.

According to this example, the length of time (temporal distance) from the combination start position represented by the arrow G11 until the noise boundary position represented by the arrow N11 is designated as the difference information with the noise boundary position. Here, the time from the combination start position until the noise boundary position is an integral multiple of the timeslot length.

By using the difference information representing the time from the combination start position until the noise boundary position obtained in this way, a more accurate combination start position may also be identified at the decoding side of the audio signal, and so audio at a higher audio quality may be obtained.

Figure 9:
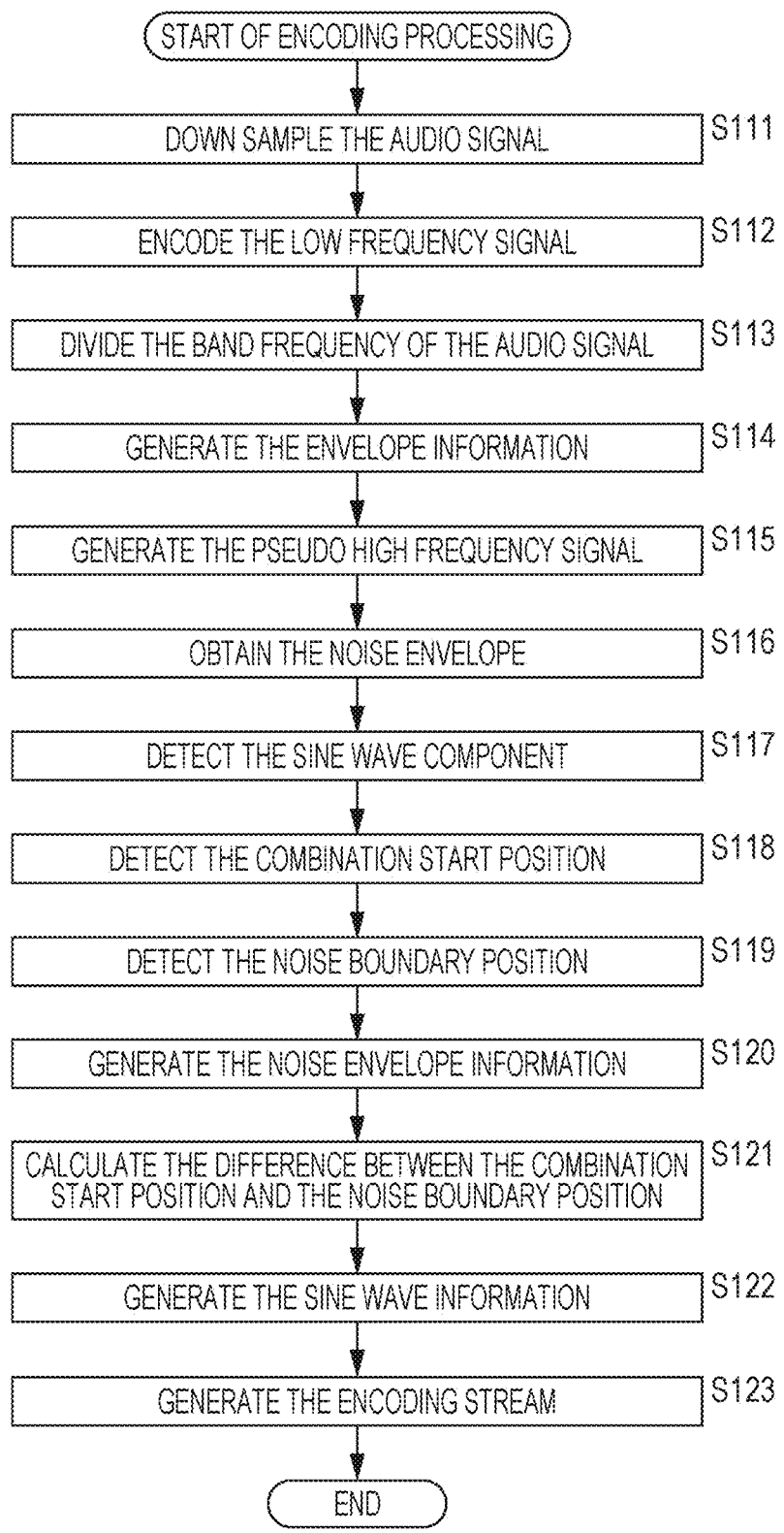
FIG. 9 is a flowchart describing an encoding processing.

Returning to the description of the flowchart in FIG. 9, after the difference information with the noise boundary position is obtained at the step S121, the processing proceeds to a step S122.

At a step S122, the sine wave information generating unit 26 generates the sine wave information for each band at the high frequency side, and supplies this to the encoding stream generating unit 27.

For example, the sine wave information generating unit 26 designates the information made up from the information representing whether or not the sine wave has been detected from the high frequency band and the difference information between the combination start position and the noise boundary position as the sine wave information. At this time, the encoding unit 63 in the sine wave information generating unit 26 performs the variable length encoding of the difference information with the noise boundary position. The sine wave information generating unit 26 supplies the sine wave information made up from the difference information processed by the variable length encoding and the information representing whether or not the sine wave signal has been detected to the encoding stream generating unit 27.

After the sine wave information is generated, the processing at a step S123 is performed and the encoding processing terminates, and as the processing at the step S123 is the same as the processing at the step S22 in FIG. 2, so its description is omitted.

As previously described, the encoding device 171 generates and outputs the encoding stream made up from the low frequency signal, the envelope information, the noise envelope information, and the sine wave information. At this time, by detecting a more accurate combination start position of the sine wave signal and generating sine wave information including the difference information used for identifying this combination start position, a more accurate combination of the sine wave signal may be performed during decoding, and so audio at a higher audio quality may be obtained as a result.

[Configuration Example of Decoding Device]

Figure 11:
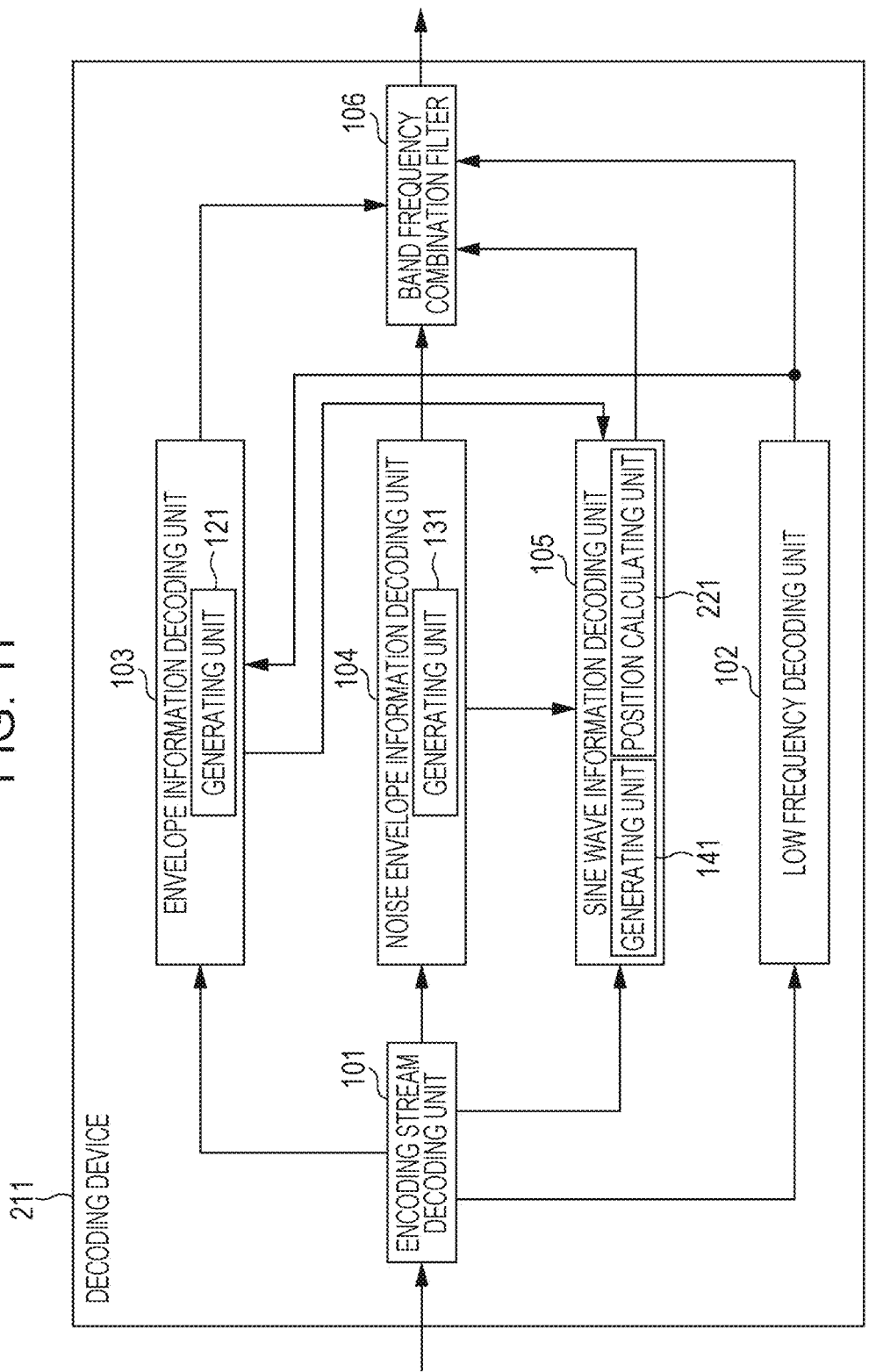
FIG. 11 is a diagram illustrating a configuration example of another decoding device.

Also, a decoding device that receives the encoding stream transmitted from the encoding device 171, and obtains the audio signal from the encoding stream is configured as illustrated in FIG. 11. Further, the components in FIG. 11 that correspond to those in FIG. 5 have the same reference numerals, and so their descriptions will be omitted as appropriate. A decoding device 211 in FIG. 11 and the decoding device 91 are different in that a position calculating unit 221 is newly provisioned in the sine wave information decoding unit 105 of the decoding device 211, and so are the same regarding other components.

The position calculating unit 221 in the decoding device 211 calculates the combination start position of the sine wave signal from the difference information obtained from the sine wave information and the noise boundary position supplied from the noise envelope information decoding unit 104.

[Description of Decoding Processing]

Next, the decoding processing performed by the decoding device 211 will be described with reference to the flowchart in FIG. 12. Note that, the processing from step S151 through step S157 is the same as the processing from step S51 through step S57 in FIG. 6, and so their descriptions are omitted. However, at the step S155, the noise envelope information decoding unit 104 supplies the information representing the noise boundary position included in the noise envelope information obtained from the decoding to the sine wave information decoding unit 105.

At a step S158, the sine wave information decoding unit 105 performs the sine wave signal generation processing, generates the sine wave signal for each band at the high frequency side, and supplies this to the band pass combination filter 106. Further, details of the sine wave signal generation processing will be described later.

After the sine wave signal generation processing has been performed, the processing at a step S159 is performed, and the decoding processing terminates, and as the processing at the step S159 is the same as the step S59 in FIG. 6, its description will be omitted.

[Description of Sine Wave Signal Generation Processing]

Figure 12:
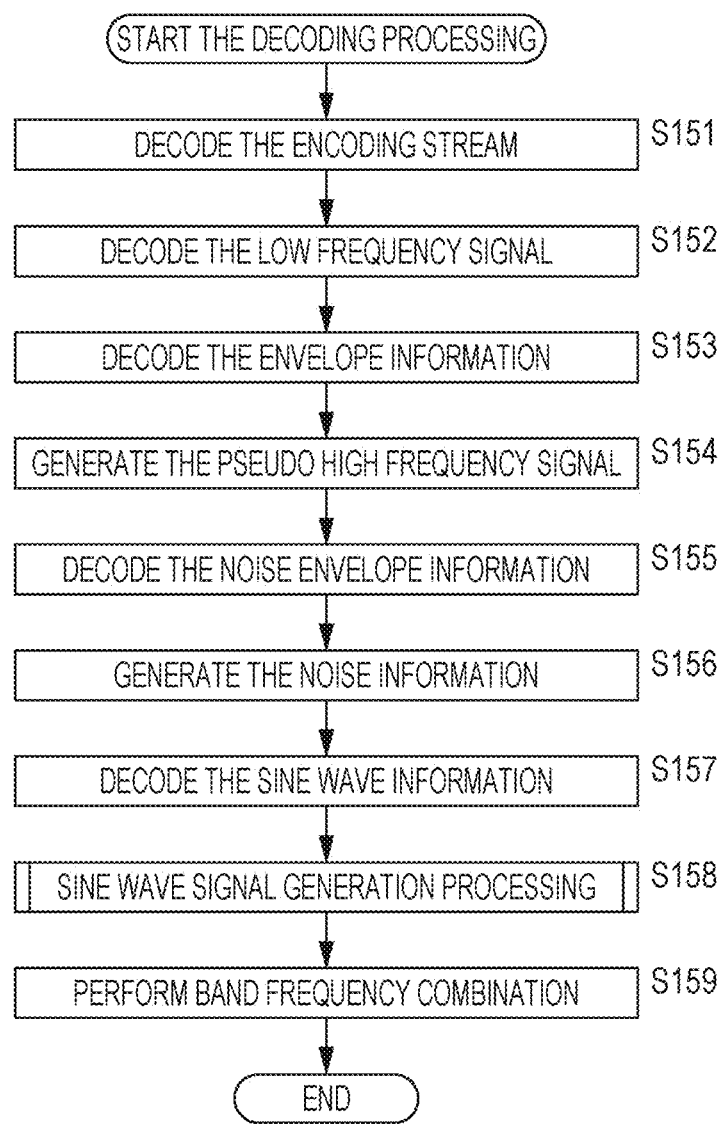
FIG. 12 is a flowchart describing a decoding processing.
Figure 13:
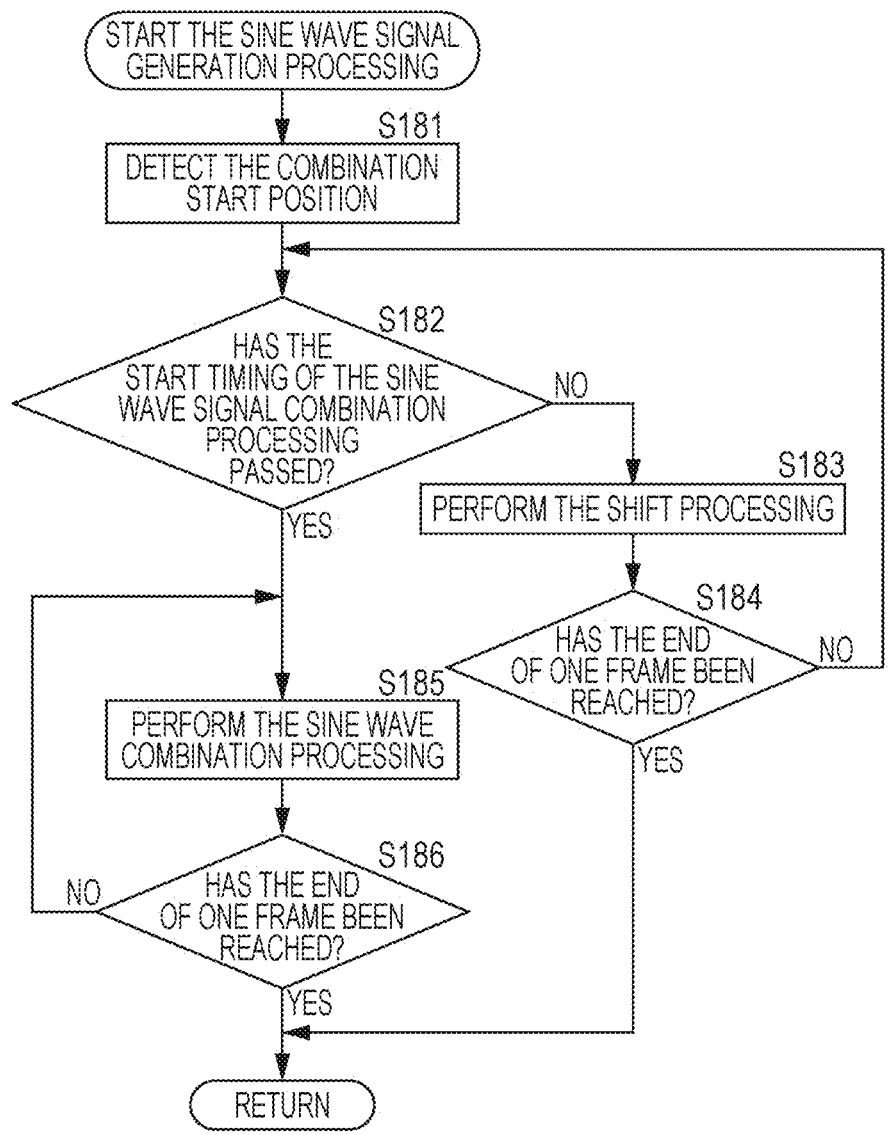
FIG. 13 is a flowchart describing a processing to generate the sine wave signal.

Also, at the step S158 in FIG. 12, the sine wave information decoding unit 105 performs the sine wave signal generation processing illustrated in FIG. 13. Hereafter, the sine wave signal generation processing corresponding to the processing at the step S158 will be described with reference to the flowchart in FIG. 13.

At a step S181, the position calculating unit 221 in the sine wave information decoding unit 105 calculates the combination start position of the sine wave signal from the noise boundary position supplied from the noise envelope information decoding unit 104 and the difference information obtained from the sine wave information. That is to say, the difference in the time between the combination start position and the noise boundary position is subtracted from the time from the start position of the frame being processed until the noise boundary position, the time from the start position of the frame until the combination start position of the sine wave signal is obtained, and the timing (sample) of the combination start position is identified.

Figure 7:
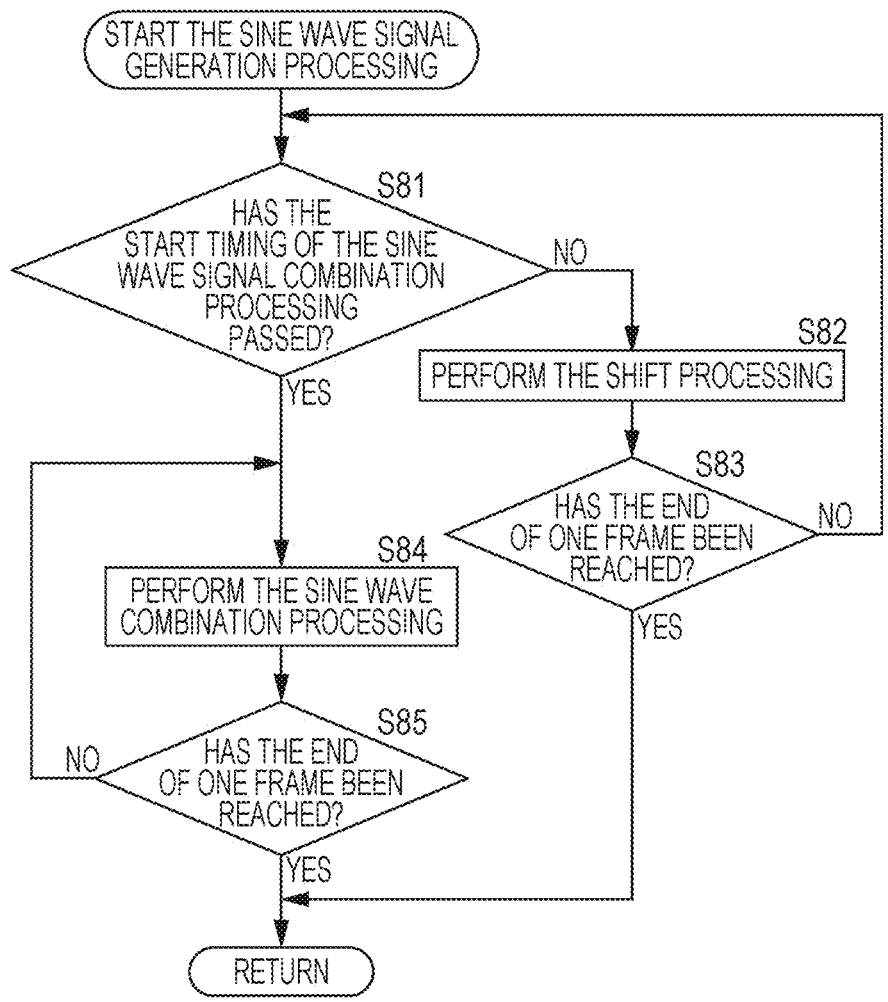
FIG. 7 is a flowchart describing a processing to generate the sine wave signal.

After the combination start position is calculated, the processing of a step S182 through a step S186 is performed, and the sine wave signal generation processing terminates, and as this processing is the same as the processing of the step S81 through the step S85 in FIG. 7, their descriptions are omitted. After the sine wave signal generation processing terminates in this way, the processing proceeds to a step S159 in FIG. 12.

In this way, the sine wave information decoding unit 105 calculates a more accurate combination start position of the sine wave signal from the difference information included in the sine wave information signal and the noise boundary position. As a result, the combination of the sine wave signal is started at a more accurate position in one frame, and so audio at a higher audio quality may be obtained.

Third Embodiment

[Configuration Example of Encoding Device]

Though the second Embodiment has been described above with an example in which the difference information between the combination start position and the noise boundary position is included in the sine wave information, information of the difference between the peak position of the combination start position and the high frequency signal envelope may be included.

Figure 14:
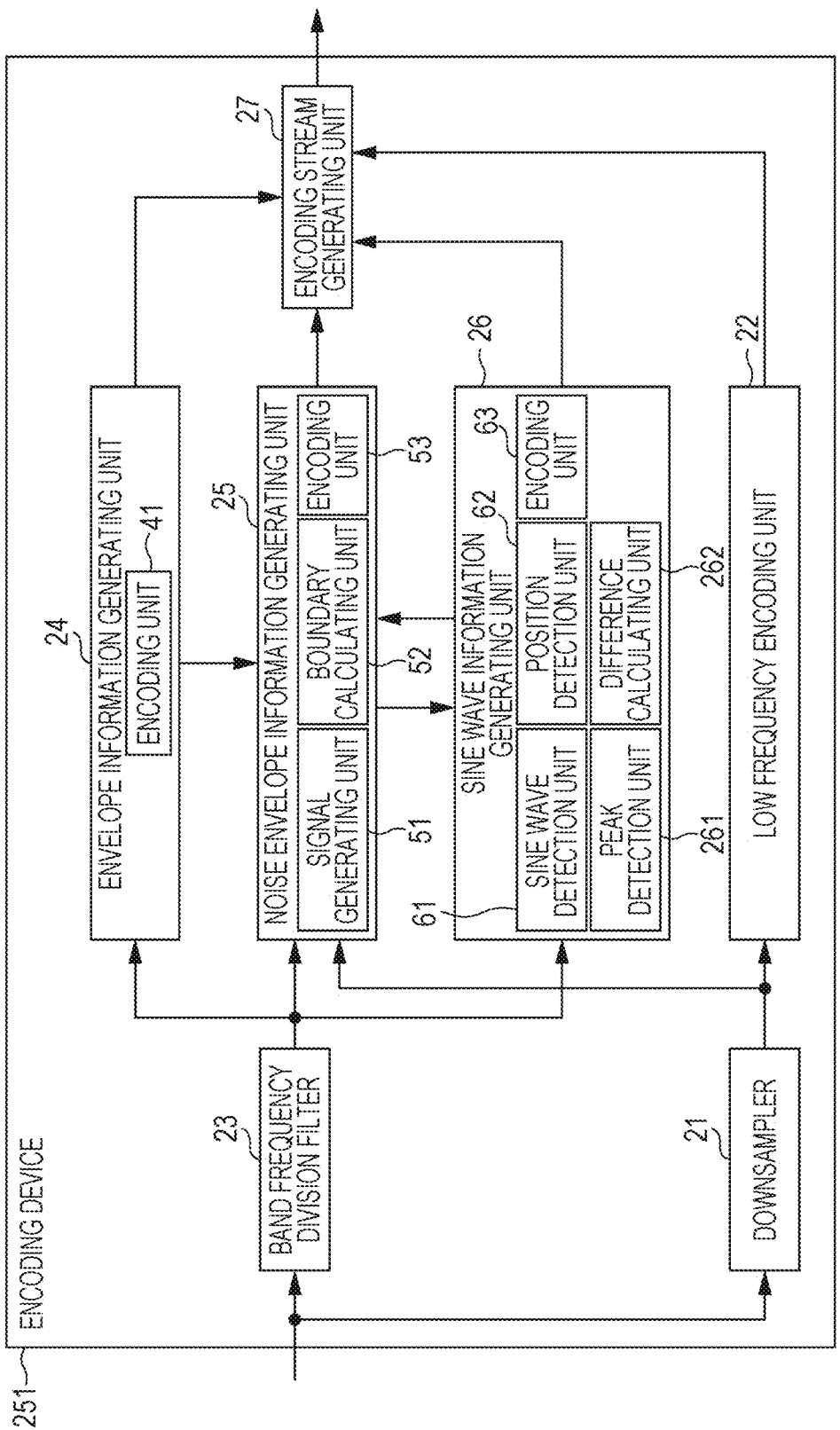
FIG. 14 is a diagram illustrating a configuration example of another encoding device.

In this case, the encoding device is configured as illustrated in FIG. 14. Further, the components in FIG. 14 that correspond to those in FIG. 1 have the same reference numerals, and so their descriptions will be omitted as appropriate. An encoding device 251 in FIG. 14 and the encoding device 11 are different in that a peak detection unit 261 and a difference calculating unit 262 are newly provisioned in the sine wave information generating unit 26 of the encoding device 251, and so are the same regarding other components.

According to the encoding device 251, the envelope information supplied from the envelope information generating unit 24 to the noise envelope information generating unit 25 is also supplied from the noise envelope information generating unit 25 to the sine wave information generating unit 26. The peak detection unit 261 detects the peak position of the high frequency signal envelope on the basis of the envelope information supplied from the noise envelope information generating unit 25.

The difference calculating unit 262 calculates the difference between the combination start position of the sine wave signal detected by the position detection unit 62 and the peak position of the high frequency signal envelope. The sine wave information generating unit 26 supplies the information made up from the difference information representing the difference with the peak position calculated by the difference calculating unit 262 and the information representing whether or not the sine wave signal has been detected to the encoding stream generating unit 27 as the sine wave information.

[Description of Encoding Processing]

Next, the encoding processing performed by the encoding device 251 will be described with reference to the flowchart in FIG. 15. Further, the processing of the step S211 through the step S218 are the same as the step S11 through the step S18 in FIG. 2, and so their description is omitted. However, at the step S214, the generated envelope information is also supplied to the sine wave information generating unit 26 from the envelope information generating unit 24 through the noise envelope information generating unit 25.

At a step S219, the peak detection unit 261 in the sine wave information generating unit 26 detects the peak position of the high frequency signal envelope on the basis of the envelope information supplied from the noise envelope information generating unit 25. For example, the position where the gain of the high frequency signal envelope represented by the envelope information is at a maximum is detected as the peak position of the high frequency signal envelope.

At a step S220, the difference calculating unit 262 calculates, for each band at the high frequency side, the difference between the combination start position of the sine wave signal detected by the position detection unit 62 and the peak position of the envelope detected by the peak detection unit 261.

Figure 16:
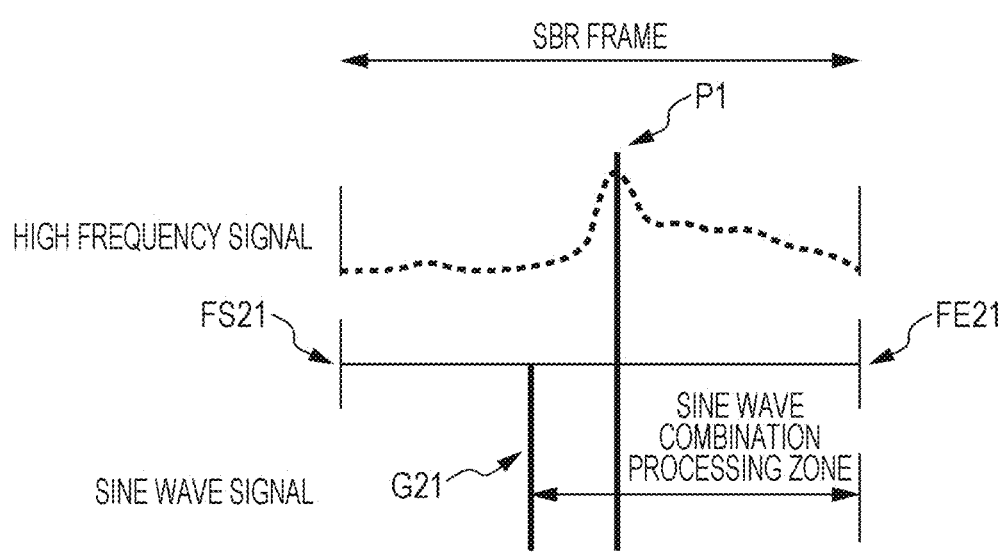
FIG. 16 is a diagram describing a combination start position of the sine wave signal.

For example, as illustrated in FIG. 16, the time (number of samples) from the start position of the sine wave combination until the peak position is calculated as the difference. Further, the horizontal axis in the figure represents the timeline. Also, an arrow FS21 and an arrow FE21 in FIG. 16 represent the start position and the end position of the frame, respectively.

According to the example in FIG. 16, the envelope of the high frequency signal is represented by a dotted line, and the position represented by an arrow P1 in the frame represents the peak position of this envelope. Also, the combination start position of the sine wave signal is the position represented by an arrow G21, and the combination start position is positioned before the peak position of the envelope. During the decoding, the sine wave signal is combined in the zone from the combination start position represented by the arrow G21 until the end position of the frame.

According to this example, the length of time (temporal distance) from the combination start position represented by the arrow G21 until the peak position of the high frequency signal envelope represented by the arrow P1 is designated as the difference with the peak position. Here, the time from the combination start position until the peak position is an integral multiple of the timeslot length.

By using the difference information representing the time from the combination start position until the peak position obtained in this way, a more accurate combination start position may be identified during decoding of the audio signal, and so audio at a higher audio quality may be obtained.

Figure 15:
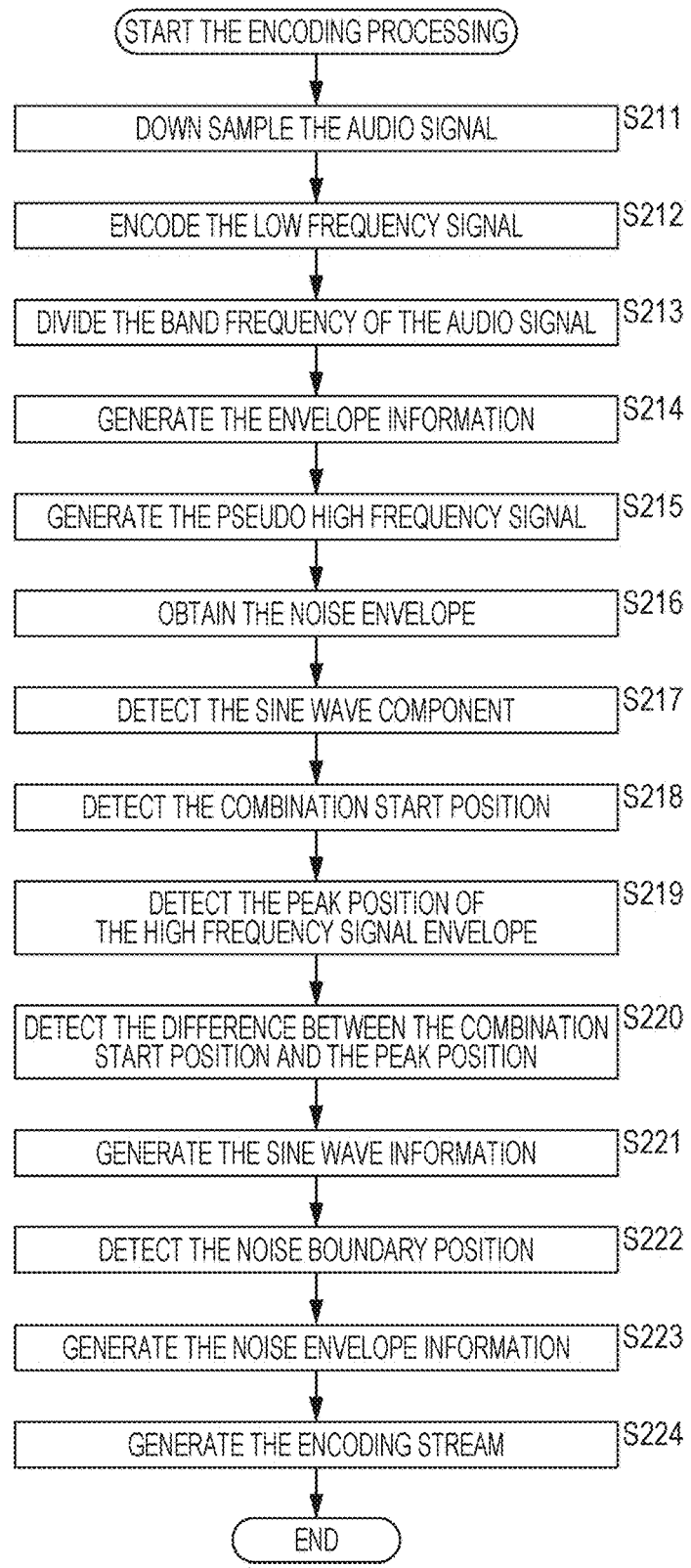
FIG. 15 is a flowchart describing an encoding processing.

Returning to the description of the flowchart in FIG. 15, after the difference information with the peak position is obtained at the step S220, the processing proceeds to a step S221.

At the step S221, the sine wave information generating unit 26 generates the sine wave information for each band at the high frequency side, and supplies this to the encoding stream generating unit 27.

For example, the sine wave information generating unit 26 designates the information made up from the information representing whether or not the sine wave has been detected from the high frequency band and the difference information between the combination start position and the peak position as the sine wave information. At this time, the encoding unit 63 in the sine wave information generating unit 26 performs the variable length encoding of the difference information with the peak position. The sine wave information generating unit 26 supplies the sine wave information made up from the difference information processed by the variable length encoding and the information representing whether or not the sine wave signal has been detected to the encoding stream generating unit 27.

After the sine wave information is generated, the processing at a step S222 through a step S224 is performed and the encoding processing terminates, and as this processing is the same as the processing at the step S20 through the step S22 in FIG. 2, so its description is omitted.

As previously described, the encoding device 251 generates and outputs the encoding stream made up from the low frequency signal, the envelope information, the noise envelope information, and the sine wave information. At this time, by detecting a more accurate combination start position of the sine wave signal and generating sine wave information including the difference information used for identifying this combination start position, a more accurate combination of the sine wave signal may be performed during decoding, and so audio at a higher audio quality may be obtained as a result.

[Configuration Example of Decoding Device]

Figure 17:
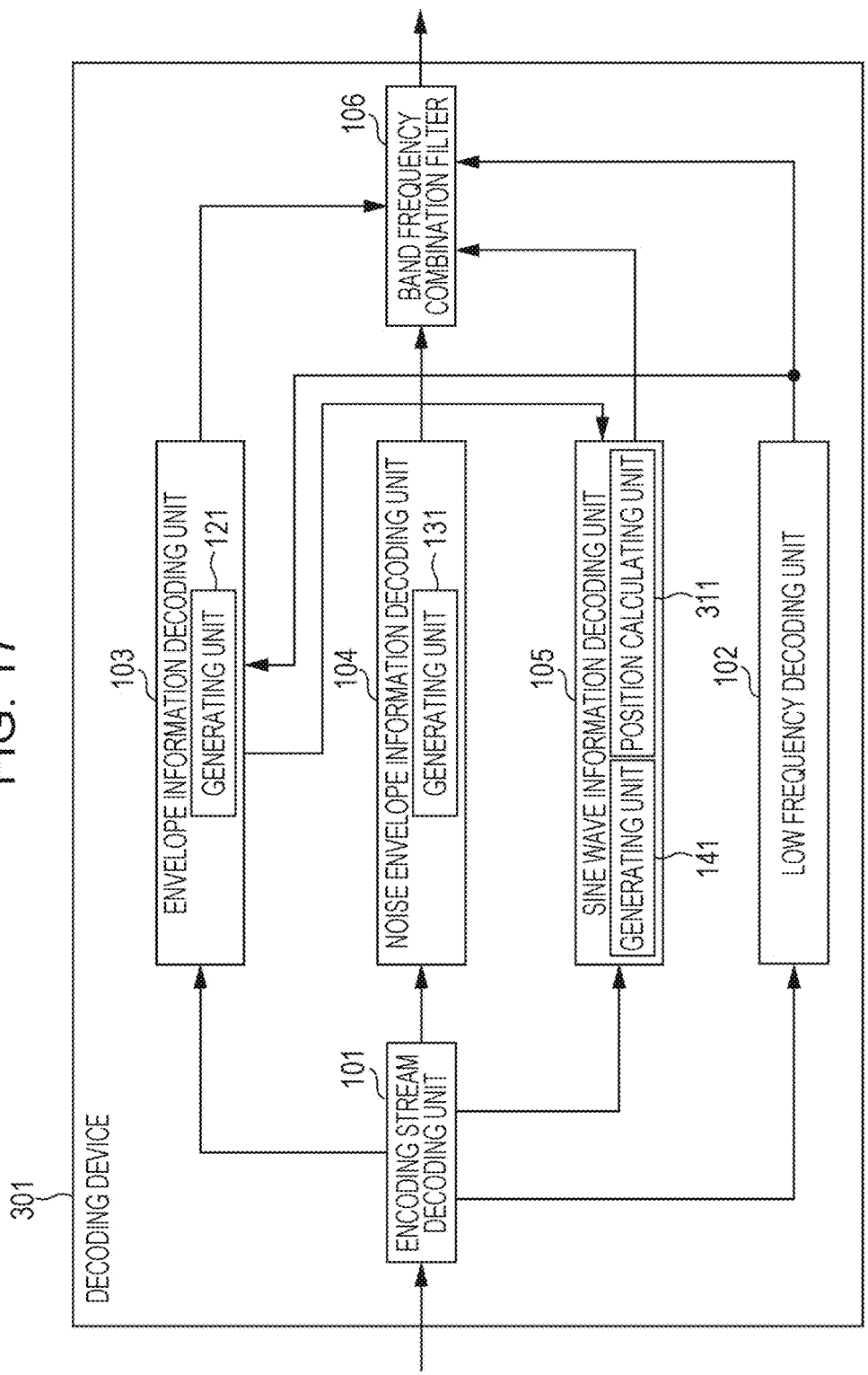
FIG. 17 is a diagram illustrating a configuration example of another decoding device.

Also, a decoding device that receives the encoding stream transmitted from the encoding device 251, and obtains the audio signal from the encoding stream is configured as illustrated in FIG. 17. Further, the components in FIG. 17 that correspond to those in FIG. 5 have the same reference numerals, and so their descriptions will be omitted as appropriate. A decoding device 301 in FIG. 17 and the decoding device 91 are different in that a position calculating unit 311 is newly provisioned in the sine wave information decoding unit 105 of the decoding device 301, and so are the same regarding other components.

The position calculating unit 311 in the decoding device 301 calculates the combination start position of the sine wave signal from the difference information obtained from the sine wave information and the envelope information supplied from the envelope information decoding unit 103.

[Description of Decoding Processing]

Next, the decoding processing performed by the decoding device 301 will be described with reference to the flowchart in FIG. 18. Further, the processing of a step S251 through a step S257 are the same as the step S51 through the step S57 in FIG. 6, and so their description is omitted.

At a step S258, the sine wave information decoding unit 105 performs the sine wave signal generation processing, generates the sine wave signal for each band at the high frequency side, and supplies this to the band pass combination filter 106. Further, details of the sine wave signal generation processing will be described later.

After the sine wave signal generation processing has been performed, the processing at a step S259 is performed, and the decoding processing terminates, and as the processing at the step S259 is the same as the step S59 in FIG. 6, its description is omitted.

[Description of Sine Wave Signal Generation Processing]

Figure 18:
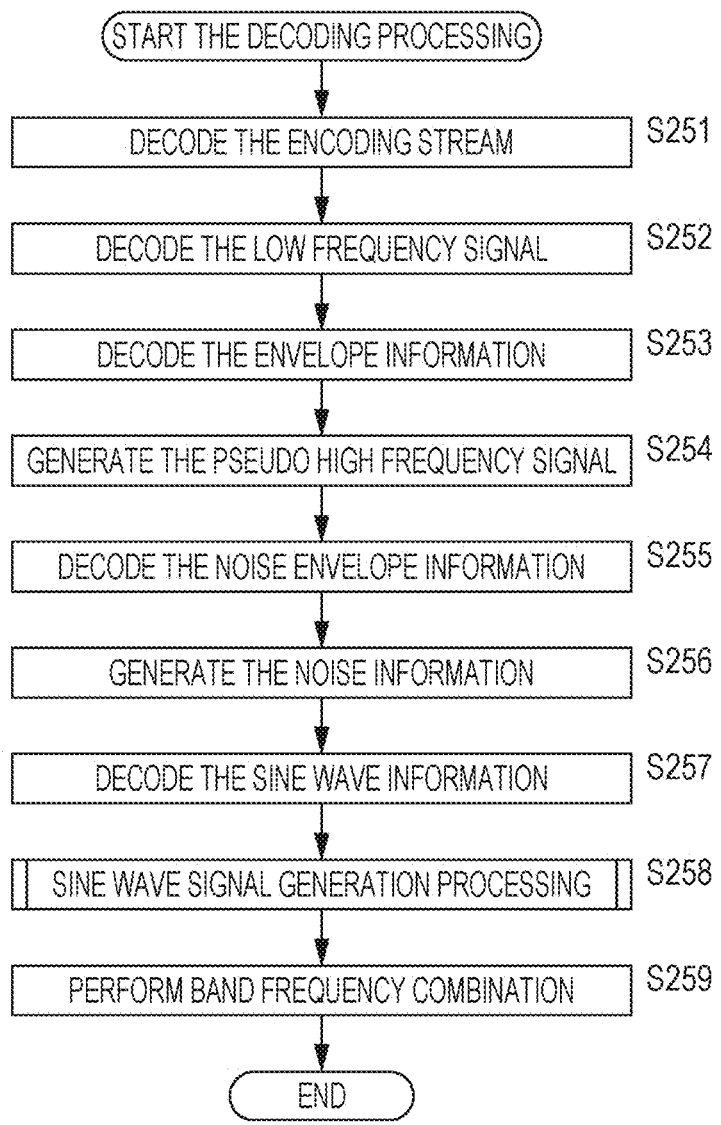
FIG. 18 is a flowchart describing a decoding processing.
Figure 19:
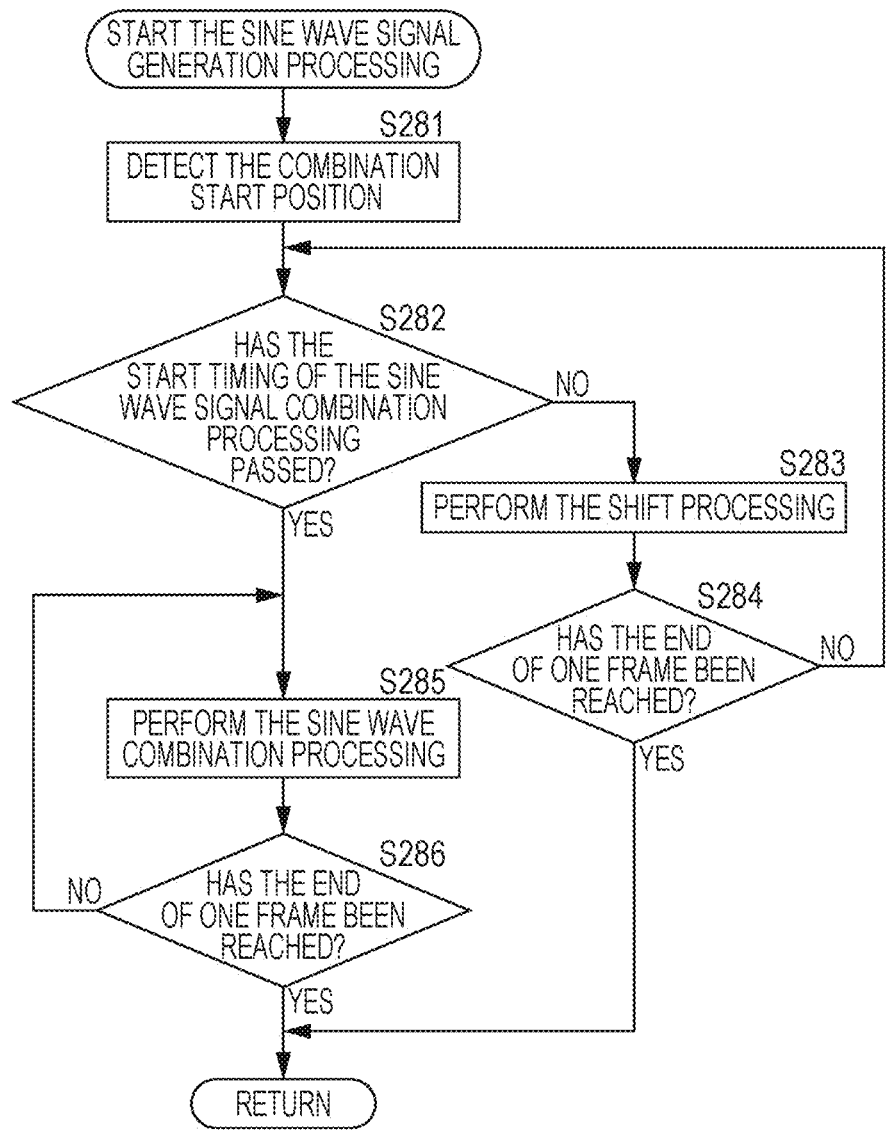
FIG. 19 is a flowchart describing a processing to generate the sine wave signal.

Also, at the step S258 in FIG. 18, the sine wave information decoding unit 105 performs the sine wave signal generation processing illustrated in FIG. 19. Hereafter, the sine wave signal generation processing corresponding to the processing at the step S258 will be described with reference to the flowchart in FIG. 19.

At a step S281, the position calculating unit 311 in the sine wave information decoding unit 105 calculates the combination start position of the sine wave signal from the envelope information supplied from the envelope information decoding unit 103 and the difference information obtained from the sine wave information.

That is to say, the position where the gain of the high frequency signal envelope represented in the envelope information is at a maximum is calculated by the position calculating unit 311 as the peak position of the high frequency signal envelope. Then, the position calculating unit 311 subtracts the difference in the time between the combination start position and the peak position is subtracted from the time from the start position of the frame being processed until the peak position, the time from the start position of the frame until the combination start position of the sine wave signal, and the timing (sample) of the combination start position is identified.

After the combination start position is calculated, the processing of a step S282 through a step S286 is performed, and the sine wave signal generation processing terminates, and as this processing is the same as the processing of the step S81 through the step S85 in FIG. 7, their descriptions are omitted. After the sine wave signal generation processing terminates in this way, the processing proceeds to a step S259 in FIG. 18.

In this way, the sine wave information decoding unit 105 calculates a more accurate combination start position of the sine wave signal from the difference information included in the sine wave information and the peak position of the high frequency signal envelope. As a result, the combination of the sine wave signal is started at a more accurate position in one frame, and so audio at a higher audio quality may be obtained.

Further, though an example has been described above in which the detection of the peak position of the envelope is performed at the decoding device 301 side, information representing the peak position may be included in the sine wave information. In this case, the sine wave information generating unit 26 in the encoding device 251 generates the sine wave information including the information representing the peak position, and the position calculating unit 311 in the decoding device 301 calculates the combination start position from the difference information and the information representing the peak position included in the sine wave information.

Fourth Embodiment

[Configuration Example of Encoding Device]

Though an example has been described above that the sine wave information included one type of previously determined information from among the combination start position, the difference information with the noise boundary position, or the difference information with the peak position, the information among these with the smallest encoding amount may be selected to be included in the sine wave information.

Figure 20:
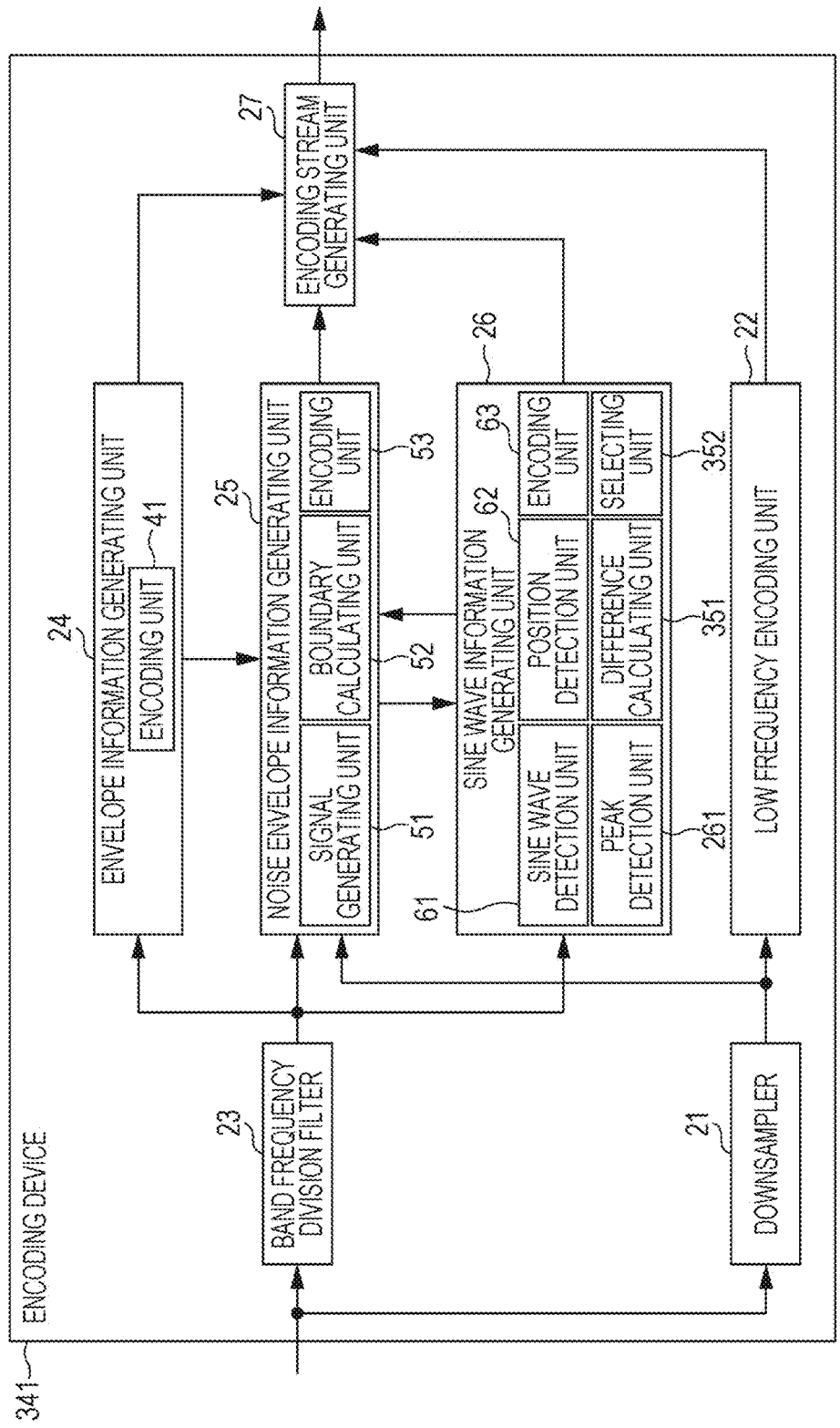
FIG. 20 is a diagram illustrating a configuration example of another encoding device.

In this case, the encoding device is configured as illustrated in FIG. 20, for example. Further, the components in FIG. 20 that correspond to those in FIG. 1 or FIG. 14 have the same reference numerals, and so their descriptions will be omitted as appropriate. An encoding device 341 in FIG. 20 and the encoding device 11 in FIG. 1 are different in that a peak detection unit 261, a difference calculating unit 351, and a selection unit 352 are newly provisioned in the sine wave information generating unit 26 of the encoding device 341, and so are the same regarding other components.

According to the encoding device 341, the envelope information supplied from the envelope information generating unit 24 to the noise envelope information generating unit 25 is also supplied from the noise envelope information generating unit 25 to the sine wave information generating unit 26, and the peak detection unit 261 detects the peak position of the high frequency signal envelope on the basis of the envelope information.

The difference calculating unit 351 calculates the difference between the combination start position of the sine wave signal detected by the position detection unit 62 and the peak position of the high frequency signal envelope. The difference calculating unit 351 also calculates the difference between the combination start position and the noise boundary position.

The selection unit 352 selects the information that will result in the smallest encoding amount after the variable length encoding from among the combination start position, the difference information with the peak position, or the difference information with the noise boundary position. The sine wave information generating unit 26 supplies the information made up from the information representing the result of the selection by the selection unit 352, the information selected by the selection unit 352, and the information representing whether or not the sine wave signal has been detected, to the encoding stream generating unit 27 as sine wave information. [Description of Encoding Processing]

Figure 21:
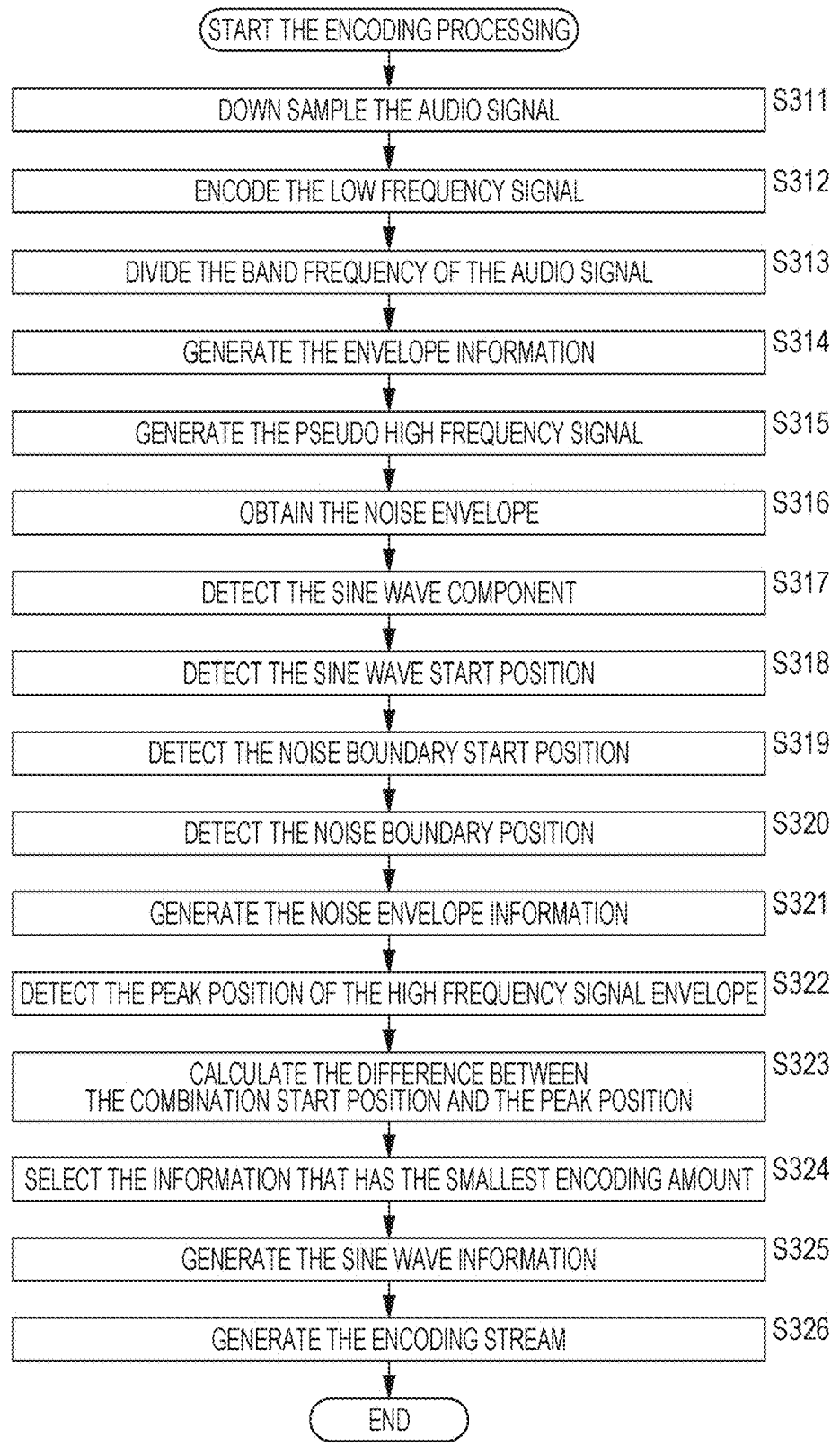
FIG. 21 is a flowchart describing an encoding processing.

Next, the encoding processing performed by the encoding device 341 will be described with reference to the flowchart in FIG. 21. Further, the processing of the step S311 through the step S321 are the same as the step S111 through the step S121 in FIG. 9, and so their description is omitted.

However, at the step S321, the difference calculating unit 351 in the sine wave information generating unit 26 calculates the difference between the combination start position of the sine wave signal detected by the position detection unit 62 and the noise boundary position for each band at the high frequency side. Also, at the step S314, the generated envelope information is also supplied to the sine wave information generating unit 26 from the envelope information generating unit 24 through the noise envelope information generating unit 25.

At a step S322, the peak detection unit 261 in the sine wave information generating unit 26 detects, for each band at the high frequency side, the peak position of the high frequency signal envelop on the basis of the envelop information supplied from the noise envelope information generating unit 25.

At a step S323, the difference calculation unit 351 calculates, for each band at the high frequency side, the difference between the combination start position of the sine wave signal detected by the position detection unit 62 and the peak position of the envelope detected by the peak detection unit 261.

Further, the same processing at the step S219 and the step S220 in FIG. 15 is performed at the step S322 and the step S323.

At a step S324, the selection unit 352 selects, for each band at the high frequency side, the information that will result in the smallest encoding amount after the variable length encoding from among the combination start position, the difference information between the combination start position and the peak position, or the difference information between the combination start position and the noise boundary position. Then, the selection unit 352 generates the selection information representing the result of this selection. At this time, only the encoding amount of the combination start position or similar may be calculated and compared, or the actual combination start position or similar information may be processed by the variable length encoding, and this encoding amount may be compared.

At the step S325, the sine wave information generating unit 26 generates the sine wave information for each band at the high frequency side, and supplies this to the encoding stream generating unit 27.

Specifically, the sine wave information generating unit 26 designates the information made up from the information representing whether or not the sine wave signal has been detected from the high frequency band, the selection information, and the information representing the selection information as the sine wave information. At this time, the encoding unit 63 in the sine wave information generating unit 26 performs the variable length encoding of the selection information and the information representing the selection information. The sine wave information generating unit 26 supplies the sine wave information made up from the selection information and the information representing the selection information processed by the variable length encoding and the information representing whether or not the sine wave signal has been detected to the encoding stream generating unit 27.

For example, when the information representing the selection information is the difference information between the combination start position and the peak position, the information made up from the selection information, the difference information with the peak position, and the information representing whether or not the sine wave signal has been detected is designated as the sine wave information. In this way, by generating the sine wave information including the information with the smallest encoding amount that identifies the combination start position of the sine wave signal, the encoding amount of the encoding stream may be further reduced.

After the sine wave information is generated, the processing at a step S326 is performed and the encoding processing terminates, and as this processing is the same as the processing at the step S224 in FIG. 15, its description is omitted.

As previously described, the encoding device 341 generates and outputs the encoding stream made up from the low frequency signal, the envelope information, the noise envelope information, and the sine wave information. At this time, by generating the sine wave information including the information with the smallest encoding amount from among the information that identifies the combination start position of the sine wave signal, the data amount of the encoding stream to be transferred may be reduced, and at the same time, a more accurate combination of the sine wave signal may be performed during decoding at the decoding side of the audio signal. As a result, audio at a higher audio quality may be obtained.

[Configuration Example of Decoding Device]

Figure 22:
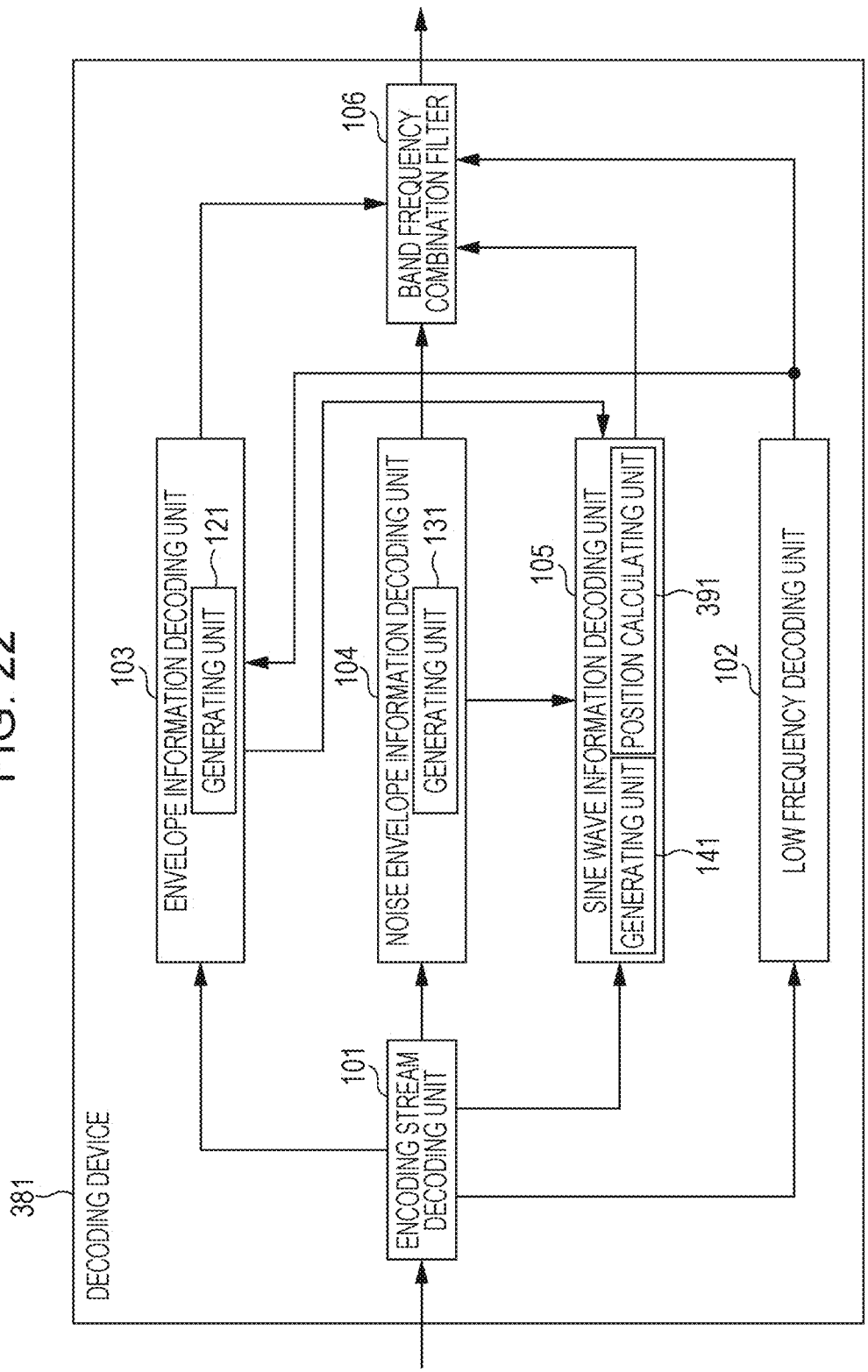
FIG. 22 is a diagram illustrating a configuration example of another decoding device.

Also, a decoding device that receives the encoding stream transmitted from the encoding device 341, and obtains the audio signal from the encoding stream is configured as illustrated in FIG. 22, for example. Further, the components in FIG. 22 that correspond to those in FIG. 5 have the same reference numerals, and so their descriptions will be omitted as appropriate. A decoding device 381 in FIG. 22 and the decoding device 91 are different in that a position calculating unit 391 is newly provisioned in the sine wave information decoding unit 105 of the decoding device 381, and so are the same regarding other components.

The position calculating unit 391 in the decoding device 381 calculates the combination start position of the sine wave signal from either the difference information with the peak position or the difference information with the noise boundary position obtained from the sine wave information, depending on the selection information included in the sine wave information.

[Description of Decoding Processing]

Next, the decoding processing performed by the decoding device 381 will be described with reference to the flowchart in FIG. 23. Further, the processing of a step S351 through a step S356 are the same as the step S51 through the step S56 in FIG. 6, and so their description is omitted.

However, at the step 355, the noise envelope information decoding unit 104 supplies the information representing the noise boundary position included in the noise envelope information obtained by the decoding to the sine wave information decoding unit 105.

At a step S357, the sine wave information decoding unit 105 decodes the sine wave information from the encoding stream decoding unit 101. For example, the selection information included in the sine wave information, and the information used to obtain the combination start position identified by the selection information, are decoded.

At a step S358, the sine wave information decoding unit 105 performs the sine wave signal generation processing, generates the sine wave signal for each band at the high frequency side, and supplies this to the band pass combination filter 106. Further, details of the sine wave signal generation processing will be described later.

After the sine wave signal generation processing has been performed, the processing at a step S359 is performed, and the decoding processing terminates, and as the processing at the step S359 is the same as the step S59 in FIG. 6, its description is omitted.

[Description of Sine Wave Signal Generation Processing]

Figure 23:
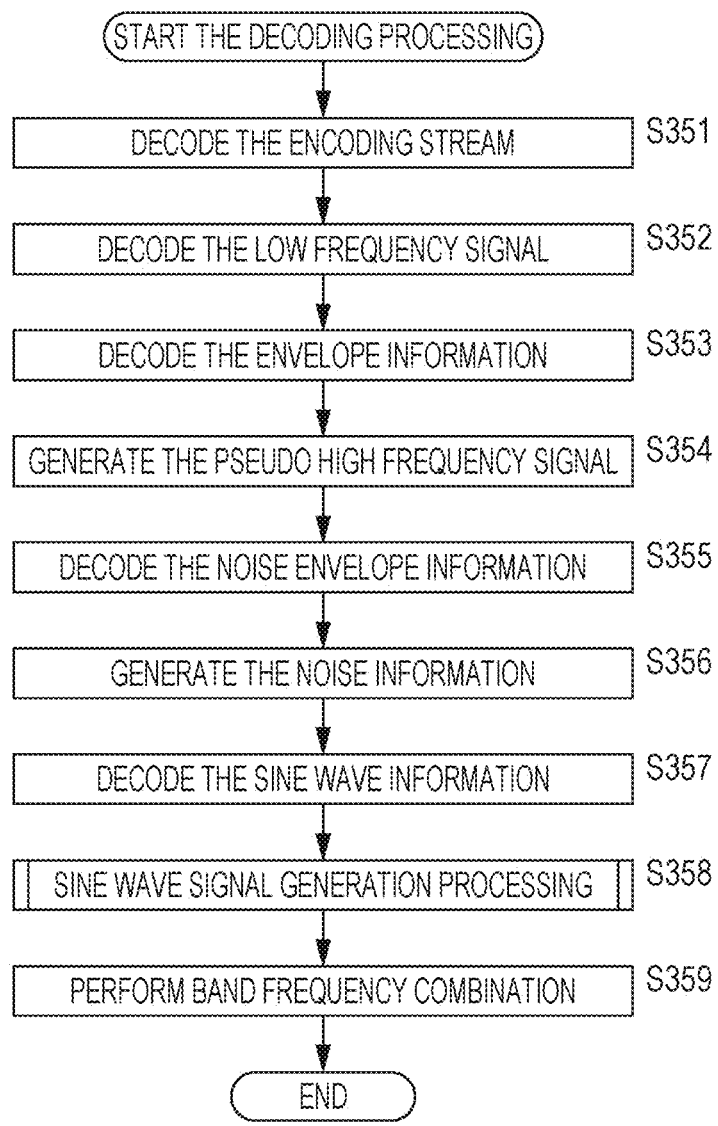
FIG. 23 is a flowchart describing a decoding processing.
Figure 24:
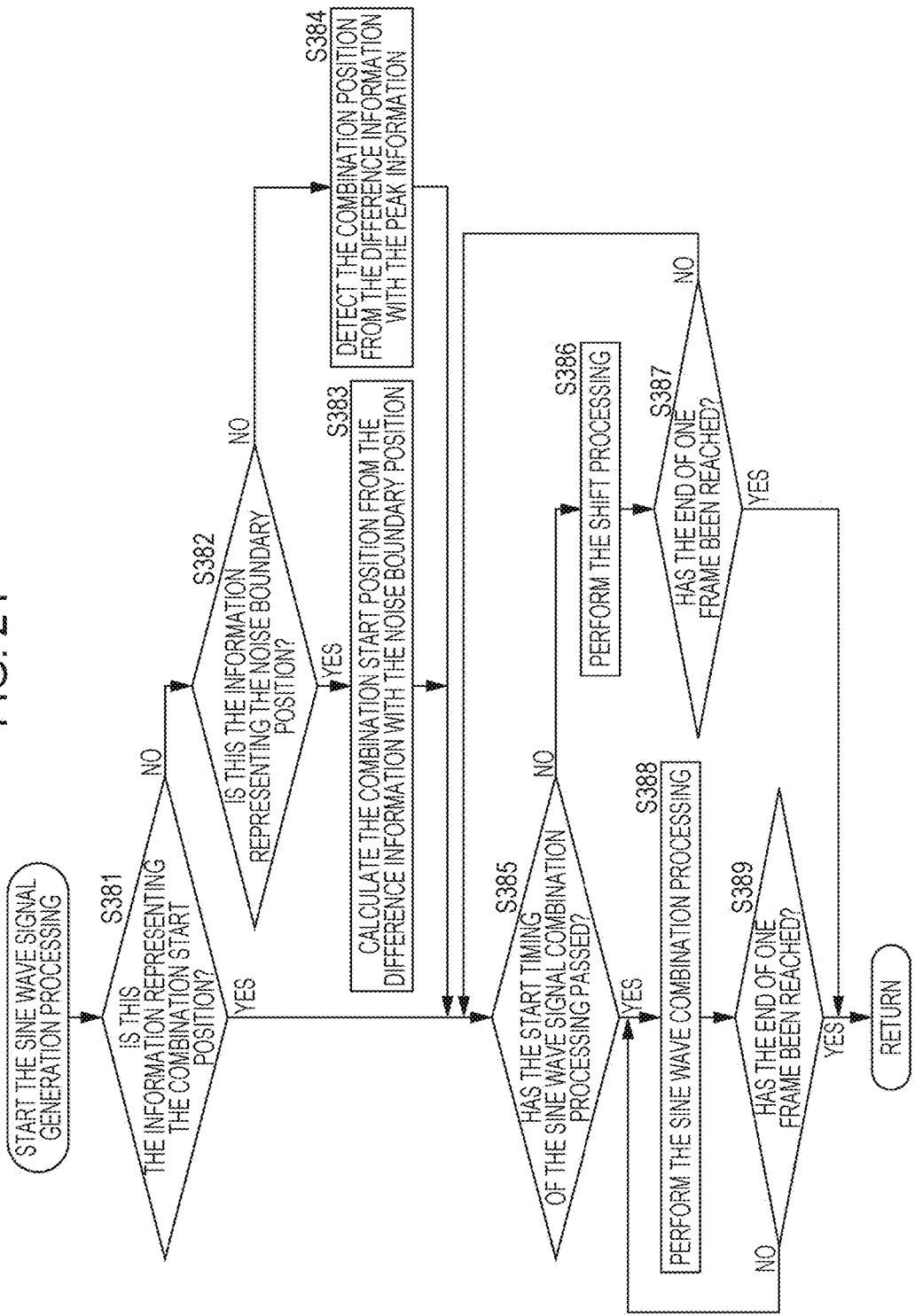
FIG. 24 is a flowchart describing a processing to generate the sine wave signal.

Also, at the step S358 in FIG. 23, the sine wave information decoding unit 105 performs the sine wave signal generation processing illustrated in FIG. 24. Hereafter, the sine wave signal generation processing corresponding to the processing at the step S358 will be described with reference to the flowchart in FIG. 24.

At a step S381, the position calculating unit 391 determines whether or not the information used to obtain the combination start position of the sine wave signal represented by the selection information is the information actually representing the combination start position. That is to say, it is determined whether or not the combination start position is included in the sine wave information.

In the event that determination is made in step S381 that the information represented by the selection information is the information representing the combination start position of the sine wave signal, the processing proceeds to a step S385.

Conversely, in the event that determination is made in step S381 that the information represented by the selection information is not be the information representing the combination start position of the sine wave signal, the processing proceeds to a step S382.

At the step S382, the position calculating unit 391 determines whether or not the information used to obtain the combination start position of the sine wave signal represented by the selection information is the difference information between the combination start position and the noise boundary position. That is to say, it is determined whether or not the difference information with the noise boundary position is included in the sine wave information.

When the information represented by the selection information is determined to be the difference information with the noise boundary position, the processing proceeds to a step S383.

At the step S383, the position calculating unit 391 in the sine wave information decoding unit 105 calculates the combination start position of the sine wave signal from the noise boundary position supplied from the noise envelope information decoding unit 104 and the difference information with the noise boundary position obtained from the sine wave information. After the combination start position is calculated, the processing proceeds to the step S385.

Also, when the information represented by the selection information is determined to not be the difference information with the noise boundary position in the step S382, that is to say, when the information represented by the selection information is the difference information between the combination start position and the peak position, the processing proceeds to a step S384.

At the step S384, the position calculating unit 391 in the sine wave information decoding unit 105 calculates the combination start position of the sine wave signal form the envelope information supplied from the envelope information decoding unit 103 and the difference information with the peak position of the high frequency signal envelope obtained from the sine wave information.

That is to say, the position calculating unit 391 detects the position where the gain in the high frequency signal envelope represented by the envelope information is at a maximum as the peak position of the high frequency signal envelope. Then, the position calculating unit 391 subtracts the difference in time between the combination start position and the peak position from the time from the start position of the frame to be processed until the peak position, obtains the time from the start position of the frame until the combination start position of the sine wave signal, and identifies the timing (sample) of the combination start position. After the combination start position is calculated, the processing proceeds to the step S385.

After the information represented by the selection information is determined to be the information representing the combination start position at the step S381, or the combination start position is calculated at the step S383, or the combination start position is calculated at the step S384, the processing proceeds to the step S385. Then, the processing of the step S382 through a step S389 is performed, and the sine wave signal generation processing terminates, and as this processing is the same as the processing of the step S81 through the step S85 in FIG. 7, their descriptions are omitted. After the sine wave signal generation processing terminates in this way, the processing proceeds to a step S359 in FIG. 23.

In this way, the sine wave information decoding unit 105 identifies the information included in the sine wave information from the selection information, and arbitrarily calculates a more accurate combination start position of the sine wave signal according to the result of this specification. As a result, the combination of the sine wave signal is started at a more accurate position in one frame, and so audio at a higher audio quality may be obtained.

The series of processing previously described may be executed by hardware, or may be executed by software. When the series of processing is executed by software, a program configuring this software may be installed into a computer built with specialized hardware, or by installing various programs from a program recording medium into a general purpose personal computer, for example, that may execute various functions.

Figure 25:
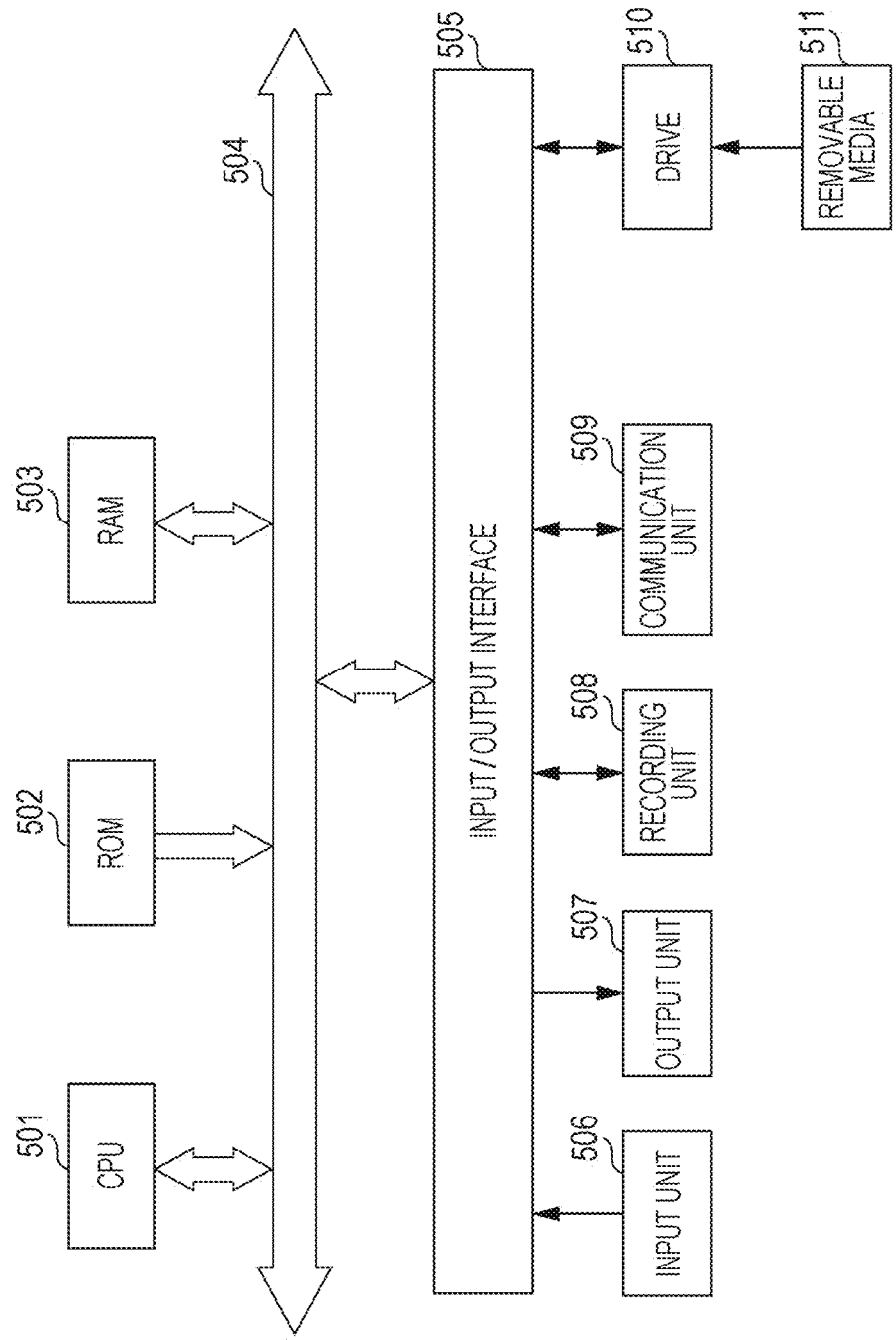
FIG. 25 is a diagram illustrating a configuration example of a computer.

FIG. 25 is a block diagram illustrating a configuration example of computer hardware for executing the previously described series of processing as a program.

A CPU 501, ROM (Read Only Memory) 502, and RAM (Random Access Memory) 503, are connected together in the computer by a bus 504.

Also, an input/output interface 505 is connected to the bus 504. Devices connected to the input/output interface 505 include an input unit 506 made up of a keyboard, a mouse, a microphone, etc., an output unit 507 made up of a display, speaker, etc., a recording unit 508 made up of a hard disk, non-volatile memory, etc., a communication unit 509 made up of a network interface, etc., and a drive 510 for driving a magnetic disk, an optical disk, a magneto-optical disk, or a removable media 511 such as semiconductor memory.

According to the computer configured in this way, the CPU 501 loads and executes the program installed in the recording unit 508 into the RAM 503 through the input/output interface 505 and bus 504, for example, to perform the previously described series of processing.

The program executed by the computer (CPU 501) may be recorded in the removable media 511, which is a form of packaged media configured of, for example, a magnetic disk (including a floppy disk), an optical disk (such as CD-ROM (Compact Disc-Read Only Memory) or DVD (Digital Versatile Disc)), a magneto-optical disk, or semiconductor memory, etc., or may be supplied via a wired or wireless transmission medium such as a local area network, the Internet, or a digital satellite broadcast.

Also, the program may be installed to the recording unit 508 through the input/output interface 505 by installing the removable media 511 to the drive 510. Also, the program may be installed to the recording unit 508 after being received by the communication unit 509 via the wired or wireless transfer medium. Also, the program may be previously installed in the ROM 502 or the recording unit 508.

Further, the program executed by the computer may perform the processing in time-sequence order as described in the present specification, may perform the processing in parallel, or at a necessary timing such as when a call is performed.

Further, the embodiments of the preset technology are not limited to the previously described embodiments, and various modifications may occur insofar as they are within the scope of the present technology.

REFERENCE SIGNS LIST 11 encoding device
22 low frequency encoding unit
24 envelope information generating unit
25 noise envelope information generating unit
26 sine wave information generating unit
52 boundary calculating unit
61 sine wave detection unit
62 position detection unit
91 decoding device
102 low frequency decoding unit
103 envelope information decoding unit
104 noise envelope information decoding unit
105 sine wave information decoding unit
141 generating unit
181 difference calculating unit 221 position calculating unit
261 peak detection unit
262 difference calculating unit
311 position detecting unit
351 difference calculating unit
352 selection unit
391 position calculating unit

The invention claimed is:

1. A signal processing device comprising:
an extracting unit that extracts a low frequency component of an audio signal, envelope information representing an envelope of a high frequency component of the audio signal, and sine wave information which includes information representing a distance from a start position of a frame of the high frequency component to an appearance start position of a sine wave component included in the high frequency component, and is for specifying a frequency and an appearance position of the sine wave component;
a pseudo high frequency generating unit that generates a pseudo high frequency signal configuring the high frequency component on the basis of a low frequency signal as the low frequency component and the envelope information;
a sine wave generating unit that generates a sine wave signal which is at a frequency represented by the sine wave information and in which the appearance start position specified from the sine wave information is set as a start position within a frame; and
a combining unit that combines the low frequency signal, the pseudo high frequency signal, and the sine wave signal to generate an audio signal.

2. The signal processing device according to claim 1, further comprising:
a noise generating unit that generates a noise signal configuring the high frequency component by adjusting a gain of sections of a predetermined signal on the basis of information representing a gain of the section represented by noise envelope information, the sections being divided by a noise boundary position represented by the noise envelope information,
wherein the extracting unit further extracts the noise envelope information, and
wherein the combining unit combines the low frequency signal, the pseudo high frequency signal, the sine wave signal, and the noise signal to generate an audio signal.

3. The signal processing device according to claim 1,
wherein the sine wave information is extracted for each frame, and the sine wave generating unit generates the sine wave signal for each frame of the high frequency component.

4. The signal processing device according to claim 1,
wherein the sine wave information is extracted for each band configuring the high frequency component, and the sine wave generating unit generates the sine wave signal for each band.

5. A signal processing method of a signal processing device including an extracting unit that extracts a low frequency component of an audio signal, envelope information representing an envelope of a high frequency component of the audio signal, and sine wave information which includes information representing a distance from a start position of a frame of the high frequency component to an appearance start position of a sine wave component included in the high frequency component, and is for specifying a frequency and an appearance position of the sine wave component, a pseudo high frequency generating unit that generates a pseudo high frequency signal configuring the high frequency component on the basis of a low frequency signal as the low frequency component and the envelope information, a sine wave generating unit that generates a sine wave signal which is at a frequency represented by the sine wave information and in which the appearance start position specified from the sine wave information is set as a start position within a frame, and a combining unit that combines the low frequency signal, the pseudo high frequency signal, and the sine wave signal to generate an audio signal, the method comprising steps of:
extracting, using the extracting unit, the low frequency component, the envelope information, and the sine wave information;
generating, using the pseudo high frequency generating unit, the pseudo high frequency signal;
generating, using the sine wave generating unit, the sine wave signal; and
combining, using the combining unit, the low frequency signal, the pseudo high frequency signal, and the sine wave signal to generate an audio signal.

6. At least one non-transitory computer-readable storage medium having encoded thereon instructions that, when executed by at least one processor, cause the at least one processor to execute a process including steps of:
extracting a low frequency component of an audio signal, envelope information representing an envelope of a high frequency component of the audio signal, and sine wave information which includes information representing a distance from a start position of a frame of the high frequency component to an appearance start position of a sine wave component included in the high frequency component, and is for specifying a frequency and an appearance position of the sine wave component;
generating a pseudo high frequency signal configuring the high frequency component on the basis of a low frequency signal as the low frequency component and the envelope information;
generating a sine wave signal which is at a frequency represented by the sine wave information and in which the appearance start position specified from the sine wave information is set as a start position within a frame; and
combining the low frequency signal, the pseudo high frequency signal, and the sine wave signal to generate an audio signal.

7. A signal processing device comprising:
an envelope information generating unit that generates envelope information representing an envelope of a high frequency signal as a high frequency component of an audio signal;
a sine wave information generating unit that detects a sine wave signal included in the high frequency signal, and generates sine wave information which includes information representing a distance from a start position of a frame of the high frequency component to an appearance start position of the sine wave signal, and is for specifying a frequency and an appearance position of the sine wave signal set as a start position within a frame; and
an output unit that generates and outputs data configured of a low frequency signal as a low frequency component of the audio signal, the envelope information, and the sine wave information.

8. The signal processing device according to claim 7, further comprising:

a noise envelope information generating unit that detects a noise signal included in the high frequency signal, and generates noise envelope information configured of information representing a noise boundary position which divides the noise signal into several sections, and information representing a gain of the noise signal of the section, wherein the output unit generates and outputs data configured of the low frequency signal, the envelope information, the sine wave information, and the noise envelope information.

9. The signal processing device according to claim 7, wherein the sine wave information is generated for each frame.

10. The signal processing device according to claim 7, wherein the sine wave information is generated for each band configuring the high frequency component.

11. A signal processing method of a signal processing device including an envelope information generating unit that generates envelope information representing an envelope of a high frequency signal as a high frequency component of an audio signal, a sine wave information generating unit that detects a sine wave signal included in the high frequency signal, and generates sine wave information which includes information representing a distance from a start position of a frame of the high frequency component to an appearance start position of the sine wave signal, and is for specifying a frequency and an appearance position of the sine wave signal set as a start position within a frame, and an output unit that generates and outputs data configured of a low frequency signal as a low frequency component of the audio signal, the envelope information, and the sine wave information, the method comprising steps of:

generating, using the envelope information generating unit, the envelope information;

generating, using the sine wave information generating unit, the sine wave information;

outputting, using the output unit, data configured of the low frequency signal, the envelope information, and the sine wave information.

12. At least one non-transitory computer-readable storage medium having encoded thereon executable instructions that, when executed by at least one processor, cause the at least one processor to execute a process including steps of:

generating envelope information representing an envelope of a high frequency signal as a high frequency component of an audio signal;

detecting a sine wave signal included in the high frequency signal, and generating sine wave information which includes information representing a distance from a start position of a frame of the high frequency component to an appearance start position of the sine wave signal, and is for specifying a frequency and an appearance position of the sine wave signal set as a start position within a frame; and generating and outputting data configured of a low frequency signal as a low frequency component of the audio signal, the envelope information, and the sine wave information.

13. A signal processing device comprising:

a low frequency decoding unit that decodes a low frequency signal as a low frequency component of an audio signal;

an envelope information decoding unit that decodes envelope information representing an envelope of a high frequency signal as a high frequency component of the audio signal;

a sine wave information decoding unit that decodes sine wave information which includes information representing a distance from a start position of a frame of the high frequency component to an appearance start position of a sine wave included in the high frequency signal, and is for specifying a frequency and an appearance position of the sine wave;

a pseudo high frequency signal generating unit that generates a pseudo high frequency signal from the decoded low frequency signal and the decoded envelope information;

a sine wave signal generating unit that generates a sine wave signal from the decoded sine wave information and in which the appearance start position specified from the sine wave information is set as a start position within a frame; and an audio signal generating unit that generates an output audio signal from the decoded low frequency signal, the pseudo high frequency signal, and the sine wave signal.

14. The signal processing device according to claim 13, further comprising:

a noise envelope information decoding unit that decodes noise envelope information configured of information representing a noise boundary position which divides the noise signal included in the high frequency signal into several sections, and information representing a gain of the noise signal of the section, wherein the pseudo high frequency signal generating unit generates a pseudo high frequency signal from the decoded low frequency signal, the decoded envelope information, and the decoded noise envelope information.

15. The signal processing device according to claim 13, wherein the sine wave information is generated for each band configuring the high frequency component.

16. A signal processing method of a signal processing device including a low frequency decoding unit that decodes a low frequency signal as a low frequency component of an audio signal, an envelope information decoding unit that decodes envelope information representing an envelope of a high frequency signal as a high frequency component of the audio signal, a sine wave information decoding unit that decodes sine wave information which includes information representing a distance from a start position of a frame of the high frequency component to an appearance start position of a sine wave included in the high frequency signal, and is for specifying a frequency and an appearance position of the sine wave, a pseudo high frequency signal generating unit that generates a pseudo high frequency signal from the decoded low frequency signal and the decoded envelope information, a sine wave signal generating unit that generates a sine wave signal from the decoded sine wave information and in which the appearance start position specified from the sine wave information is set as a start position within a frame, and an audio signal generating unit that generates an output audio signal from the decoded low frequency signal, the pseudo high frequency signal, and the sine wave signal, the method comprising steps of:

decoding, using the low frequency decoding unit, the low frequency signal;

decoding, using the envelope information decoding unit, the envelope information;

decoding, using the sine wave information decoding unit, the sine wave information;

generating, using the pseudo high frequency signal generating unit, the pseudo high frequency signal;

generating, using the sine wave signal generating unit, the sine wave signal; and generating, using the audio signal generating unit, the output audio signal.

17. At least one non-transitory computer-readable storage medium having encoded thereon instructions that, when executed by at least one processor, cause the at least one processor to execute a process including steps of:

decoding a low frequency signal as a low frequency component of an audio signal;

decoding envelope information representing an envelope of a high frequency signal as a high frequency component of the audio signal;

decoding sine wave information which includes information representing a distance from a start position of a frame of the high frequency component to an appearance start position of a sine wave included in the high frequency signal, and is for specifying a frequency and an appearance position of the sine wave;

generating a pseudo high frequency signal from the decoded low frequency signal and the decoded envelope information;

generating a sine wave signal from the decoded sine wave information and in which the appearance start position specified from the sine wave information is set as a start position within a frame; and generating an output audio signal from the decoded low frequency signal, the pseudo high frequency signal, and the sine wave signal.

\* \* \* \* \*